(12) United States Patent
Wu et al.

(10) Patent No.: US 10,210,803 B2
(45) Date of Patent: Feb. 19, 2019

(54) PIXEL CIRCUIT AND DRIVING METHOD THEREOF, AND DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Tong Wu, Shanghai (CN); Zeyuan Chen, Shanghai (CN); Yue Li, Shanghai (CN); Dongxu Xiang, Shanghai (CN); Renyuan Zhu, Shanghai (CN); Gang Liu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 6 days.

(21) Appl. No.: 15/588,112

(22) Filed: May 5, 2017

(65) Prior Publication Data

US 2017/0243537 A1  Aug. 24, 2017

(30) Foreign Application Priority Data

Dec. 23, 2016 (CN) .......................... 2016 1 1203523

(51) Int. Cl.
*G09G 3/3233* (2016.01)
*H01L 27/12* (2006.01)
*H01L 29/786* (2006.01)

(52) U.S. Cl.
CPC ... *G09G 3/3233* (2013.01); *G09G 2320/0233* (2013.01); *G09G 2330/02* (2013.01); *H01L 27/1251* (2013.01); *H01L 29/78645* (2013.01)

(58) Field of Classification Search
CPC .... G09G 3/3208; G09G 3/3233; G09G 3/325; G09G 3/3291; G09G 2300/0809;
(Continued)

(56) References Cited

U.S. PATENT DOCUMENTS

2004/0008074 A1* 1/2004 Takehara ............. G09G 3/3283
327/524
2005/0104817 A1* 5/2005 Kwak .................. G09G 3/2022
345/76
(Continued)

FOREIGN PATENT DOCUMENTS

CN 102665321 A 9/2012
CN 103295519 A 9/2013
(Continued)

*Primary Examiner* — Michael J Eurice
(74) *Attorney, Agent, or Firm* — Anova Law Group, PLLC

(57) ABSTRACT

A pixel circuit and driving method thereof, and a display device are provided. The pixel circuit comprises a light-emitting element, a first, second, third, and fourth transistors, and a capacitor element. The first transistor is configured to time-sharingly receive a data voltage and a power supply voltage under control of a first voltage signal. The second transistor is configured to detect and compensate a threshold voltage deviation of the first transistor under control of a first scanning signal. The third transistor is configured to provide a driving current generated by the first transistor to the light-emitting element under control of a light-emitting signal. The fourth transistor is configured to transmit a reset signal to an anode of the light-emitting element under control of a second scanning signal. The capacitor element is configured to store the data voltage transmitted to the first transistor. The light-emitting element is configured to emit light.

20 Claims, 11 Drawing Sheets

(58) Field of Classification Search
CPC ... G09G 2300/0842; G09G 2300/0861; G09G 2320/0233; G09G 2320/043; G09G 2320/045; G09G 2330/02; G09G 2330/028; H01L 27/1251; H01L 27/3262; H01L 29/78645
See application file for complete search history.

(56) References Cited

U.S. PATENT DOCUMENTS

| | | | |
|---|---|---|---|
| 2005/0110723 A1* | 5/2005 | Shin | G09G 3/3233 345/76 |
| 2005/0117410 A1* | 6/2005 | Shin | G09G 3/325 365/189.09 |
| 2005/0264498 A1* | 12/2005 | Asano | G09G 3/3233 345/76 |
| 2006/0022909 A1* | 2/2006 | Kwak | G09G 3/3233 345/76 |
| 2006/0158396 A1* | 7/2006 | Jo | G09G 3/3283 345/76 |
| 2006/0245121 A1* | 11/2006 | Numao | G09G 3/325 361/18 |
| 2007/0063962 A1* | 3/2007 | Nanataki | G02F 1/133602 345/102 |
| 2007/0097059 A1* | 5/2007 | Tanaka | G09G 3/3648 345/98 |
| 2007/0109232 A1* | 5/2007 | Yamamoto | G09G 3/3233 345/77 |
| 2007/0115225 A1* | 5/2007 | Uchino | G09G 3/3233 345/76 |
| 2007/0118781 A1* | 5/2007 | Kim | G09G 3/3233 714/727 |
| 2007/0120813 A1* | 5/2007 | Huitema | G09G 3/344 345/107 |
| 2007/0126680 A1* | 6/2007 | Han | G09G 3/3233 345/92 |
| 2008/0143653 A1* | 6/2008 | Shishido | G09G 3/3233 345/78 |
| 2008/0150846 A1* | 6/2008 | Chung | G09G 3/3233 345/80 |
| 2009/0109142 A1* | 4/2009 | Takahara | G09G 3/006 345/76 |
| 2009/0201231 A1* | 8/2009 | Takahara | G09G 3/3233 345/76 |
| 2010/0194718 A1* | 8/2010 | Morita | G09G 3/3688 345/204 |
| 2010/0225623 A1* | 9/2010 | Ohhashi | G09G 3/3233 345/205 |
| 2011/0157126 A1* | 6/2011 | Chung | G09G 3/3233 345/211 |
| 2012/0105387 A1* | 5/2012 | Choi | G09G 3/3225 345/204 |
| 2013/0057532 A1* | 3/2013 | Lee | G09G 3/3225 345/211 |
| 2013/0135275 A1* | 5/2013 | Okuno | G09G 3/3291 345/211 |
| 2013/0169170 A1* | 7/2013 | Shih | H05B 33/0815 315/173 |
| 2013/0207957 A1* | 8/2013 | Lin | G09G 3/3241 345/212 |
| 2014/0049180 A1* | 2/2014 | Kwak | H05B 33/0896 315/224 |
| 2014/0333682 A1* | 11/2014 | Okuno | G09G 3/3233 345/690 |
| 2014/0346487 A1* | 11/2014 | Asano | G09G 3/3233 257/40 |
| 2015/0002557 A1* | 1/2015 | Ishii | G09G 3/3291 345/690 |
| 2015/0035734 A1* | 2/2015 | Lee | G09G 3/3258 345/76 |
| 2015/0154906 A1* | 6/2015 | Chung | G09G 3/3233 345/212 |
| 2015/0154941 A1* | 6/2015 | Kanda | G09G 5/18 345/213 |
| 2015/0199932 A1* | 7/2015 | Ohara | G09G 3/3233 345/212 |
| 2016/0071458 A1* | 3/2016 | Tan | G09G 3/3233 345/212 |
| 2016/0189606 A1* | 6/2016 | Chen | G09G 3/3233 345/214 |
| 2016/0247449 A1* | 8/2016 | Yin | G09G 3/3233 |
| 2016/0275869 A1* | 9/2016 | Hwang | G09G 3/3258 |
| 2016/0343298 A1* | 11/2016 | Xu | G09G 3/3233 |
| 2016/0365035 A1* | 12/2016 | Park | G09G 3/3266 |
| 2017/0061928 A1* | 3/2017 | Kim | G09G 3/20 |
| 2017/0110049 A1* | 4/2017 | Choi | G09G 3/2092 |
| 2017/0132975 A1* | 5/2017 | Park | G09G 3/3233 |
| 2017/0269747 A1* | 9/2017 | Hu | G06F 3/0412 |
| 2018/0053470 A1* | 2/2018 | Morita | G09G 3/3258 |

FOREIGN PATENT DOCUMENTS

| | | |
|---|---|---|
| CN | 103295524 A | 9/2013 |
| CN | 103594053 A | 2/2014 |
| CN | 104361857 A | 2/2015 |
| CN | 104465715 A | 3/2015 |
| CN | 105989805 A | 10/2016 |
| JP | 2010145579 A | 7/2010 |
| KR | 20130055450 A | 5/2013 |

* cited by examiner

PIXEL CIRCUIT AND DRIVING METHOD THEREOF, AND DISPLAY DEVICE

CROSS-REFERENCES TO RELATED APPLICATIONS

This application claims priority of Chinese Patent Application No. 201611203523.1, filed on Dec. 23, 2016, the entire contents of which are hereby incorporated by reference.

FIELD OF THE DISCLOSURE

The present disclosure generally relates to the field of display technology and, more particularly, relates to a pixel circuit and driving method thereof, and a display device.

BACKGROUND

As the display technology develops, improvement of pixels per inch (PPI) has been a research direction of display panels. High PPI display panels can provide more precise images and improve the display quality. Further, display devices such as visual reality (VR) display and augmented reality (AR) display need high PPI display panels to satisfy display needs.

In existing pixel circuits, the number of electronic elements is relatively large. Often, a pixel circuit includes at least six or seven transistors and at least one capacitor element. Accordingly, the circuit wiring is relatively complex. In display panels with the same dimension, the high PPI display panels can hold more sub-pixels, and the arrangement of the sub-pixels in the high PPI display panels is denser. Accordingly, the region for wiring signal lines need to be reduced. Restricted by various existing factors such as fabrication devices and materials, disposing complex pixel circuits in the high PPI display panels is often difficult. Thus, reducing the amount of electronic elements included is the pixel circuits is one of the research directions in current display technologies.

The disclosed pixel circuit and driving method thereof, and display device are directed to solving at least partial problems set forth above and other problems.

BRIEF SUMMARY OF THE DISCLOSURE

One aspect of the present disclosure provides a pixel circuit. The pixel circuit comprises a light-emitting element, a first transistor, a second transistor, a third, transistor, a fourth transistor, and a capacitor element. The first transistor is configured to time-sharingly receive a data voltage and a power supply voltage under control of a first voltage signal and to generate a driving current based on the data voltage. The second transistor is configured to detect and compensate a threshold voltage deviation of the first transistor under control of a first scanning signal. The third transistor is configured to provide the driving current to the light-emitting element via the first transistor under control of a light-emitting signal. The fourth transistor is configured to transmit an anode reset signal to an anode of the light-emitting element under control of a second scanning signal. The capacitor element is configured to store the data voltage transmitted to the first transistor. The light-emitting element is configured to emit light in response to the driving current generated by the first transistor.

Another aspect of the present disclosure provides a driving method of a pixel circuit. The pixel circuit in dudes a light-emitting element, a first transistor configured to time-sharingly receive a data voltage and a power supply voltage under control of a first voltage signal, a second transistor configured to detect and compensate a threshold voltage deviation of the first transistor under control of a first scanning signal, a third transistor configured to provide a driving current generated by the first transistor to the light-emitting element under control of a light-emitting signal, a fourth transistor configured to transmit a reset signal to the light-emitting element under control of a second scanning signal, and a first capacitor connected to the first transistor. The driving method comprises in a processing stage, fulfilling initialization and threshold detection of the pixel circuit, and in a display stage, configuring the light-emitting element to emit light.

Another aspect of the present disclosure provides a driving method of a pixel circuit. The pixel circuit includes a light-emitting element, a first transistor configured to time-sharingly receive a data voltage and a power supply voltage under control of a first voltage signal, a second transistor configured to detect and compensate a threshold voltage deviation of the first transistor under control of a scanning signal, a third transistor configured to provide a driving current generated by the first transistor to the light-emitting element under control of a light-emitting signal, a fourth transistor configured to transmit a reset signal to the light-emitting element under control of the scanning signal, and a first capacitor connected to the first transistor. The driving method comprises in a first stage, configuring the scanning signal to have a first voltage level, and configuring the light-emitting signal to have the first voltage level; in a second stage, configuring the scanning signal to have the first voltage level, configuring the light-emitting signal to have the second voltage level, and providing the data voltage to the first electrode of the first transistor; and in a third stage, configuring the scanning signal to have the second voltage level, configuring the light-emitting signal to have the first voltage level, and providing the power supply voltage to the first electrode of the first transistor.

Other aspects of the present disclosure can be understood by those skilled in the art in light of the description, the claims, and the drawings of the present disclosure.

BRIEF DESCRIPTION OF THE DRAWINGS

Other features, goals, and advantages of the present disclosure will become more apparent via a reading of detailed descriptions of non-limiting embodiments with reference to the accompanying drawings.

DETAILED DESCRIPTION

The foregoing and other objects, features, and advantages of the present disclosure will be more apparent from the following description of embodiments as illustrated in the accompanying drawings. The drawings are not necessarily to scale, emphasis instead being placed upon illustrating principles of the present disclosure.

Specific details are set forth in the following descriptions to provide a full understanding of aspects and embodiments of tire present disclosure. The present disclosure may also be implemented through various manners other than those described herein, and similar variations and extensions can be made by those skilled in the art without departing from the spirit of the present disclosure. Therefore, the present disclosure is not limited to specific embodiments disclosed hereinafter.

Figure 1:
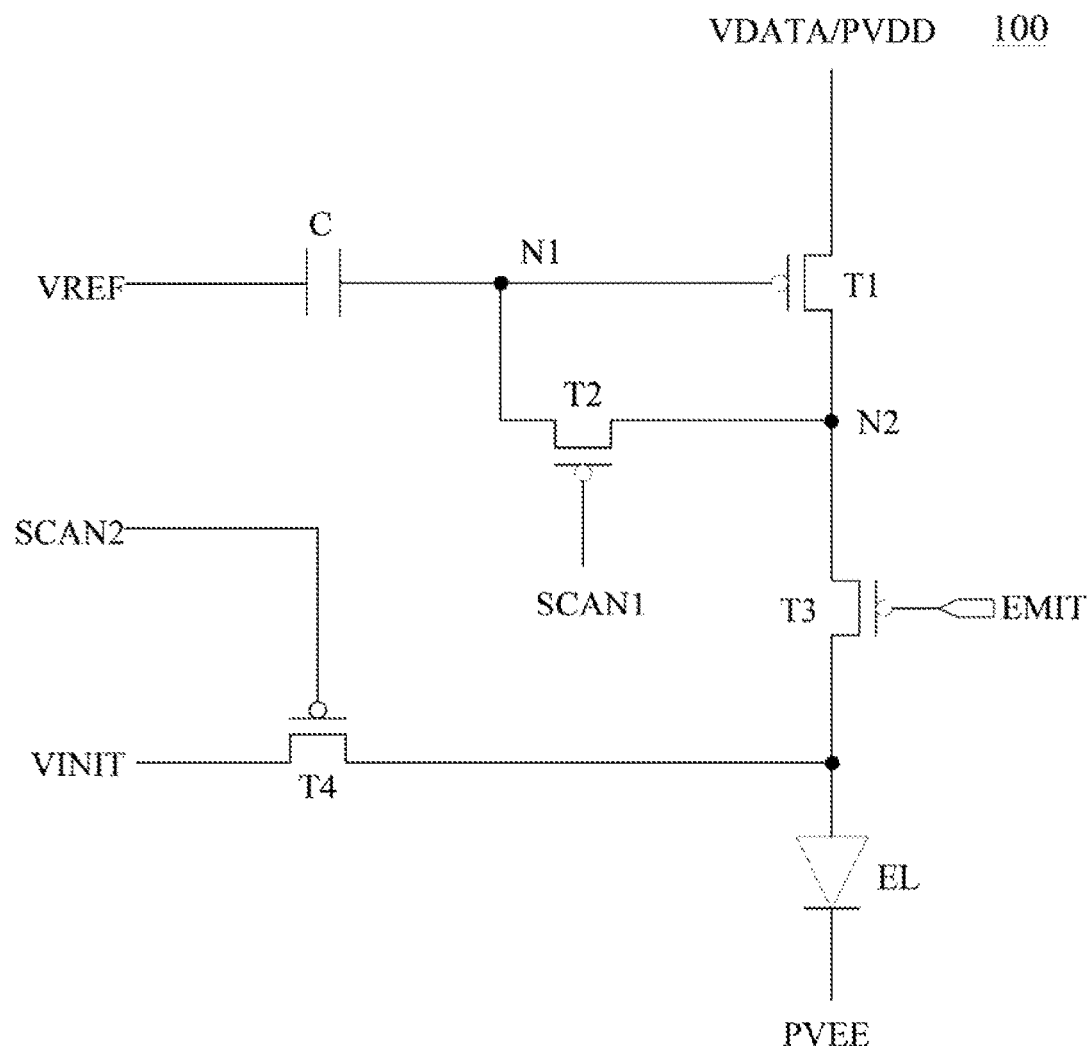
FIG. 1 illustrates an exemplary structural schematic view of a pixel circuit according to embodiments of the present disclosure.

FIG. 1 illustrates an exemplary structural schematic view of a pixel circuit 100 according to embodiments of the present disclosure. As shown in FIG. 1, the pixel circuit 100 may include a first transistor T1, a second transistor T2, a third transistor T3, a fourth transistor T4, a capacitor element C, and a light-emitting element EL.

More specifically, the first transistor T1 may be configured to under control of a first voltage signal, time-sharingly receive a data voltage VDATA and a power supply voltage PVDD. Further, based on the data voltage VDATA, the first transistor T1 may generate a driving current. In the disclosed pixel circuit 100, the first voltage signal may be an initialization voltage VINIT, and the first transistor T1 may be a driving transistor.

The second transistor T2 may be configured to, under control of a first scanning signal SCAN1, detect and compensate the deviation in the threshold voltage of the first transistor T1. The third transistor T3 may be configured to under control of a light-emitting signal EMIT, transmit the driving current generated by the first transistor T1 to the light-emitting element EL.

The fourth transistor T4 may be configured to, under control of a second scanning signal SCAN2, transmit an anode reset signal to an anode of the light-emitting element EL. In the disclosed pixel circuit 100, the anode reset signal may be she initialization voltage VINIT. Further, the capacitor element C may be configured to store the data voltage VDATA transmitted to the first transistor T1. The light-emitting element EL may be configured to emit light in response to the driving current generated by the first transistor T1.

The disclosed pixel circuit 100 may include four transistors, one capacitor element, and one light-emitting element, thereby displaying reduced number of electronic elements and simplifying the circuit wiring. Accordingly, by using the disclosed pixel circuit 100, the demand for high PPI display device may be satisfied.

When the pixel circuit 100 is under work, the threshold detection and compensation of the first transistor T1 (i.e., the driving transistor) may be effectively implemented, the gate electrode of the first transistor T1 and the anode of the light-emitting element EL may be reset, and the display unevenness induced fey threshold voltage drift of the first transistor T1 may be avoided. Accordingly, the light-emitting element EL may be driven to stably emit light.

Further, the first transistor T1 of the pixel circuit 100 may be configured to time-sharingly receive the data voltage VDATA and the power supply voltage PVDD. Thus, the data voltage VDATA and the power supply voltage PVDD may be supplied by one signal line time-sharingly. Accordingly, the amount of circuit wires may be reduced, and the circuit wiring arrangement of the display device may be simplified, thereby providing display devices with higher PPI.

In some optional implementations, referring to FIG. 1, a gate electrode of the first transistor T1 may be connected to a first node N1, a first electrode of the first transistor T1 may time-sharingly receive the data voltage VDATA and the power supply voltage PVDD, and a second electrode of the first transistor T1 may be connected to a second node N2. A gate electrode of the second transistor T2 may be configured to receive the first scanning signal SCAN1, a first electrode of the second transistor T2 may be connected to the first node N1, and a second electrode of the second transistor T2 may be connected to the second node N2.

A gate electrode of the third transistor T3 may be configured to receive the light-emitting signal EMIT, a first electrode of the third transistor T3 may be connected to the second node N2, and a second electrode of the third transistor T3 may be connected to the anode of the light-emitting element EL. A gate electrode of the fourth transistor T4 may be configured to receive the second scanning signal SCAN2, a first electrode of the fourth transistor T4 may be configured to receive the initialization voltage VINIT, and a second electrode of the fourth transistor T4 may be connected to the anode of the light-emitting element EL.

Optionally, a cathode of the light-emitting element EL may be connected to a fixed voltage signal PVEE, and the voltage level of the fixed voltage signal PVEE may be configured to be higher than or equal to the initialization voltage VINIT. Further, a first plate of the capacitor element C may be connected to the first node N1, and a second plate of the capacitor element C may be configured to receive a fixed voltage signal. In the disclosed pixel circuit 100, the fixed voltage signal received by the second plate of the capacitor element C may be a reference voltage VREF.

Figure 2:
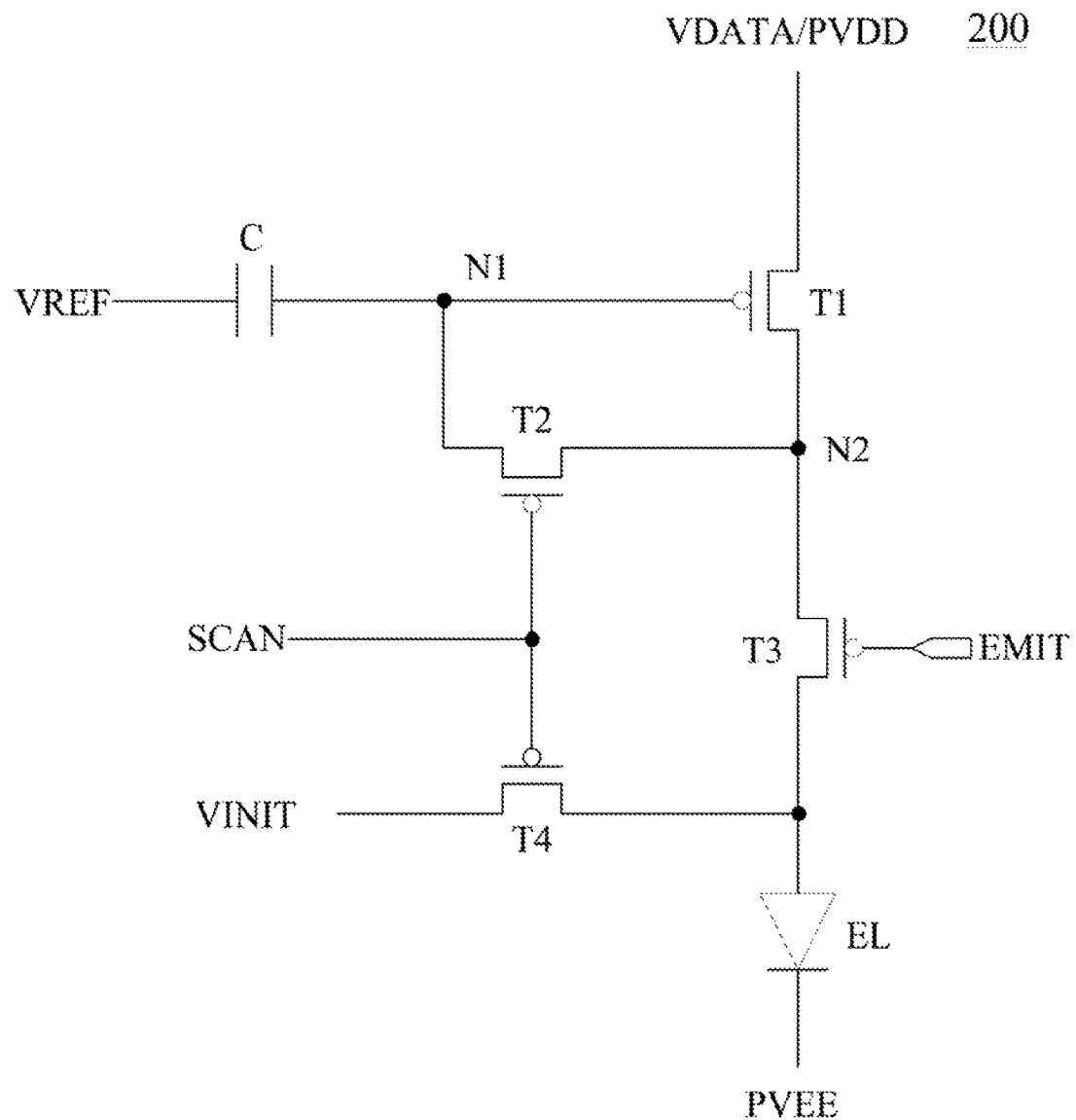
FIG. 2 illustrates an exemplary structural schematic view of another pixel circuit according to embodiments of the present disclosure.

FIG. 2 illustrates an exemplary structural schematic view of another pixel circuit 200 according to embodiments of the present disclosure. FIG. 2 may use the same or similar drawing reference numerals as that in FIG. 1, and the similarities may not be repeated here. The difference between the pixel circuit 200 in FIG. 2 and the pixel circuit 100 in FIG. 1 may lie in that in FIG. 2, the first scanning signal SCAN1 and the second scanning signal SCAN2 are the same scanning signal, and are denoted as "SCAN".

Accordingly, in some optional implementation methods, the gate electrode of the second transistor T2 and the gate electrode of the fourth transistor T4 may be electrically connected to receive the scanning signal SCAN. That is, in the disclosed pixel circuit 200, the number of terminals for scanning signals may be reduced, and the circuit wiring may be simplified.

Figure 3:
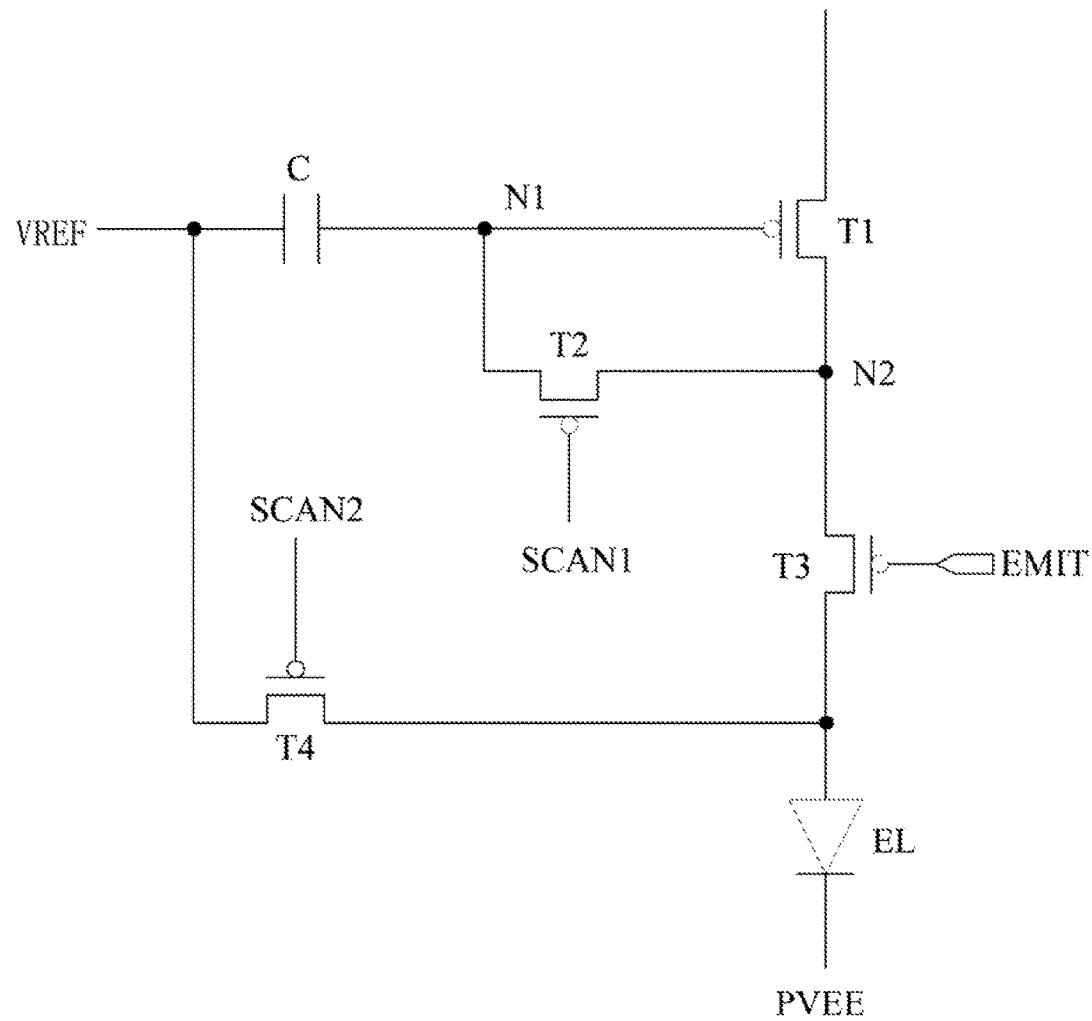
FIG. 3 illustrates an exemplary structural schematic view of another pixel circuit according to embodiments of the present disclosure.

FIG. 3 illustrates an exemplary structural schematic view of another pixel circuit 300 according to embodiments of the present disclosure. As shown in FIG. 3, the pixel circuit may include a first transistor T1, a second transistor T2, a third transistor T3, a fourth transistor T4, a capacitor element C, and a light-emitting element EL.

More specifically, the first transistor T1 may be configured to, under control of a first voltage signal, time-sharingly receive a data voltage VDATA and a power supply voltage PVDD. Further, based on the data voltage VDATA, the first transistor T1 may generate a driving current. In the disclosed pixel circuit 300, the first voltage signal may be the reference voltage VREF.

The second transistor T2 may be configured to, under control of a first scanning signal SCAN1, detect and compensate threshold voltage deviation of the first transistor T1. The third transistor T3 may be configured to, under control of a light-emitting signal EMIT, transmit the driving current generated by the first transistor T1 to the light-emitting element EL.

The fourth transistor T4 may be configured to, under control of a second scanning signal SCAN2, transmit an anode reset signal to an anode of the light-emitting element EL. In the disclosed pixel circuit 300, the reference voltage VREF may be multiplexed as the anode reset signal because such a configuration may not affect the voltage level at the node N1. Further, the capacitor element C may be configured to store the data voltage VDATA transmitted to the first transistor T1. The light-emitting element EL may be configured to emit light in response to the driving current generated by the first transistor T1.

The disclosed pixel circuit 300 may include four transistors, one capacitor element, and one light-emitting element, thereby displaying reduced amount of electronic elements and simplifying the circuit wiring. Accordingly, by using the disclosed pixel circuit 100, the demand for high PPI display device may be satisfied.

When the pixel circuit 300 is under work, the threshold detection and compensation of the driving transistor T1 may be effectively implemented, the gate electrode of the first transistor T1 and the anode of the light-emitting element EL may be reset, and the display unevenness induced by threshold voltage drift of the first transistor T1 may be avoided. Accordingly, the light-emitting element EL may be stably driven to emit light.

Further, the first transistor T1 of the pixel circuit 300 may be configured to time-sharing receive the data voltage VDATA and the power supply voltage PVDD. Thus, the data voltage VDATA and the power supply voltage PVDD may be supplied by one signal line time-sharingly. Accordingly, the amount of circuit wires may be reduced, and the circuit wiring arrangement of the display device may be simplified, thereby providing display devices with higher PPI.

Further, in the pixel circuit 300, the reference voltage VREF may be configured to control the first transistor T1, and the reference voltage VREF may act as the anode reset signal of the light-emitting element EL. Accordingly, the number of circuit wires may be further reduced.

In some optional implementations, referring to FIG. 3, a gate electrode of the first transistor T1 may be connected to a first node N1, a first electrode of the first transistor T1 may time-sharingly receive the data voltage VDATA and the power supply voltage PVDD, and a second electrode of the first transistor T1 may be connected to a second node N2. A gate electrode of the second transistor T2 may be configured to receive the first scanning signal SCAN1, a first electrode of the second transistor T2 may be connected to the first node N1, and a second electrode of the second transistor T2 may be connected to the second node N2.

A gate electrode of the third transistor T3 may be configured to receive the light-emitting signal EMIT, a first electrode of the third transistor T3 may be connected to the second node N2, and a second electrode of the third transistor T3 may be connected to the anode of the light-emitting element EL. A gate electrode of the fourth transistor T4 may be configured to receive the second scanning signal SCAN2, a first electrode of the fourth transistor T4 may be configured to receive the reference voltage VREF, and a second electrode of the fourth transistor T4 may be connected to the anode of the light-emitting element EL.

Optionally, a cathode of the fight-emitting element EL may be connected to a fixed voltage signal PVEE. Further, a first plate of the capacitor element C may be connected to the first node N1, and a second plate of the capacitor element C may be configured to receive a fixed voltage signal. In the disclosed pixel circuit 300, the fixed voltage signal received by the second plate of the capacitor element C may be the reference voltage VREF.

Figure 4:
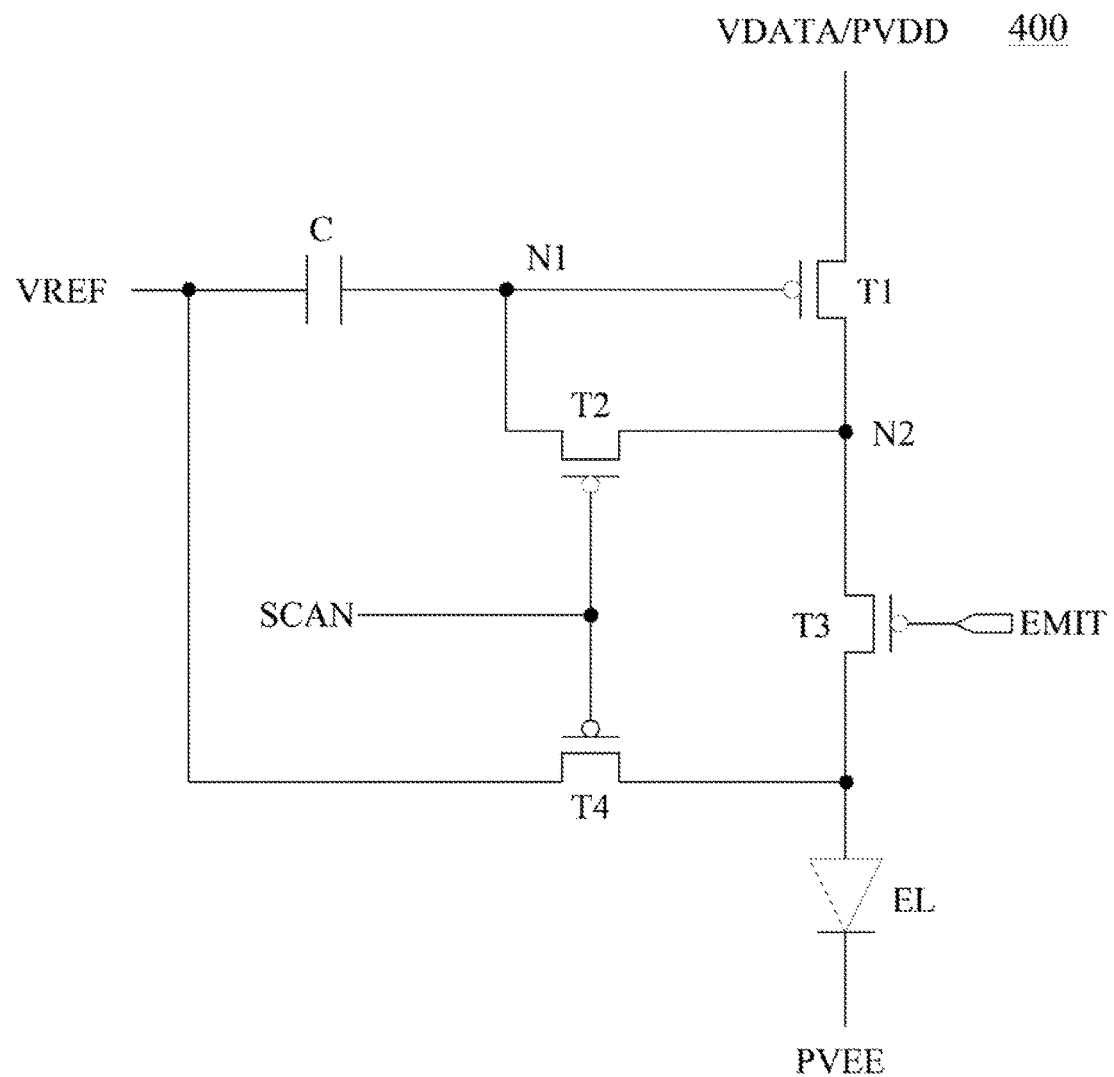
FIG. 4 illustrates an exemplary structural schematic view of another pixel circuit according to embodiments of the present disclosure.

FIG. 4 illustrates an exemplary structural schematic view of another pixel circuit according to embodiments of the present disclosure. FIG. 4 may use the same or similar drawing reference numerals as that in FIG. 3, and the similarities may not be repeated here. The difference between the pixel circuit 400 in FIG. 4 and the pixel circuit 300 in FIG. 3 lies in that in FIG. 4, the first scanning signal SCAN1 and the second scanning signal SCAN2 may be the same scanning signal that is denoted by SCAN.

Accordingly, in some optional implementation methods, the gate electrode of the second transistor T2 and the gate electrode of the fourth transistor T4 may be electrically connected to receive the scanning signal SCAN. That is, in the disclosed pixel circuit 400, the terminals for scanning signals may be reduced, and the circuit wiring may be simplified.

Figure 5:
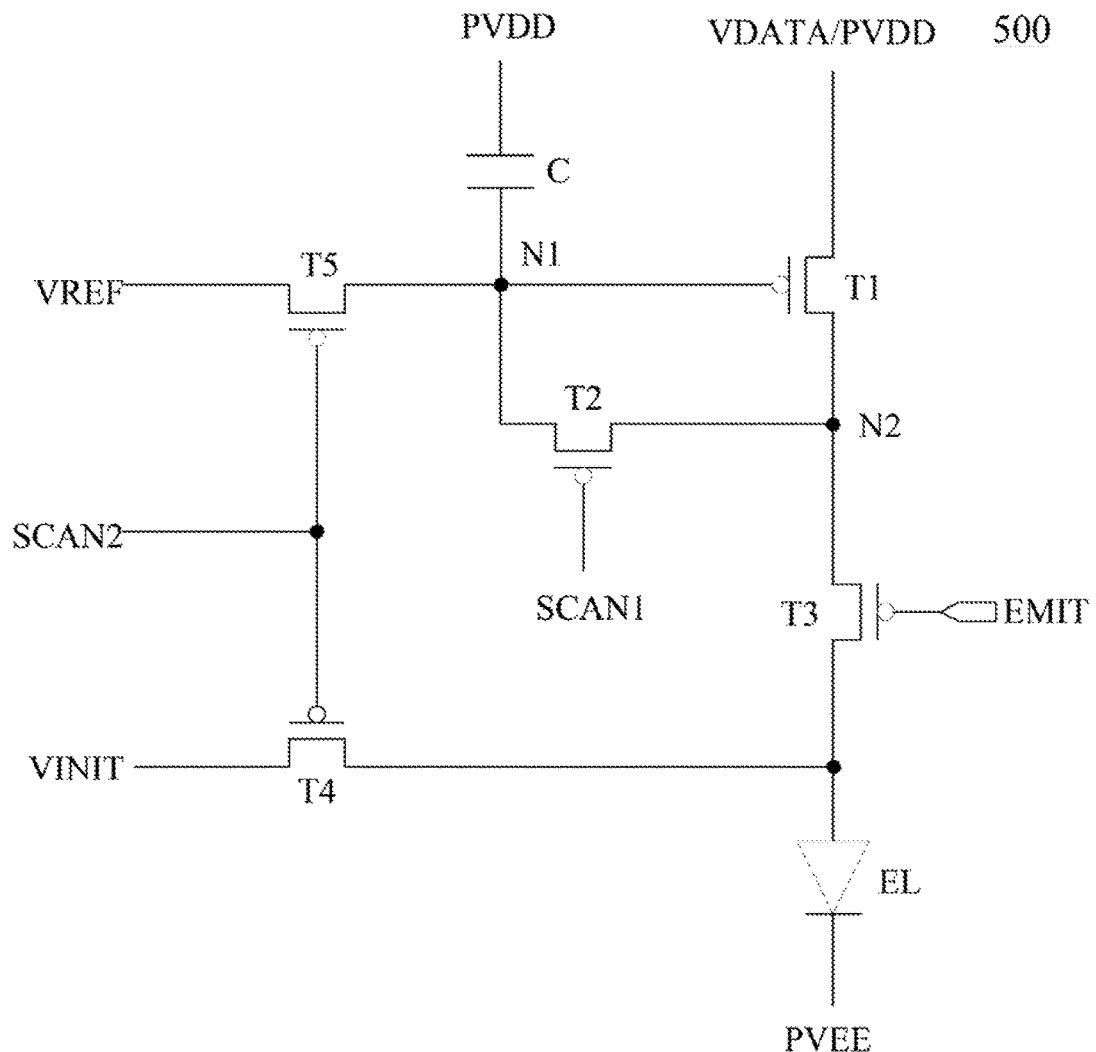
FIG. 5 illustrates an exemplary structural schematic view of mother pixel circuit according to embodiments of the present disclosure.

FIG. 5 illustrates an exemplary structural schematic view of another pixel circuit 500 according to embodiments of the present disclosure. As shown in FIG. 5, the pixel circuit 500 may include a first transistor T1, a second transistor T2, a third transistor T3, a fourth transistor T4, a fifth transistor T5, a capacitor element C, and a light-emitting element EL.

More specifically, the first transistor T1 may be configured to, under control of a first voltage signal, time-sharingly receive a data voltage VDATA and a power supply voltage PVDD. Further, based on the data voltage VDATA, the first transistor T1 may generate a driving current. In the disclosed pixel circuit 500, the first voltage signal may be the reference voltage VREF.

The second transistor T2 may be configured to, under control of a first scanning signal SCAN1, detect and compensate threshold voltage deviation of the first transistor T1. The third transistor T3 may be configured to, under control of a light-emitting signal EMIT, transmit the driving current generated by the first transistor T1 to the light-emitting element EL. The fourth transistor T4 may be configured to, under control of a second scanning signal SCAN2, transmit an anode reset signal to an anode of the light-emitting element EL. In the disclosed pixel circuit 500, the anode reset signal may be the initialization voltage VINIT.

The fifth transistor T5 may be configured to, under control of the second scanning signal SCAN2, transmit the reference voltage VREF to the control the first transistor T1.

Further, the capacitor element C may be configured to store the data voltage VDATA transmitted to the first transistor T1. The light-emitting element EL may be configured to emit light in response to the driving current generated by the first transistor T1.

The disclosed pixel circuit 500 may include five transistors, one capacitor element, and one light-emitting element, thereby displaying reduced number of electronic elements and simplified circuit wiring with respect to existing pixel circuit. Accordingly, by using the disclosed pixel circuit 100, the demand for high PPI display device may be satisfied.

When the pixel circuit 500 is under work, the threshold detection and compensation of the driving transistor T1 may be effectively implemented, the gate electrode of the first transistor T1 and the anode of the light-emitting element EL may be reset, and the display unevenness induced by threshold voltage drift of the first transistor T1 may be avoided. Accordingly, the light-emitting element EL may be driven stably to emit light.

Further, the first transistor T1 of the pixel circuit 500 may be configured to time-sharingly receive the data voltage VDATA and the power supply voltage PVDD. Thus, the data voltage VDATA and the power supply voltage PVDD may be supplied by one signal line time-sharingly. Accordingly, the amount of circuit wires may be reduced, and the circuit wiring arrangement of the display device may be simplified, thereby providing display devices with higher PPI.

In some optional implementations, referring to FIG. 5, a gate electrode of the first transistor T1 may be connected to a first node N1, a first electrode of the first transistor T1 may time-sharingly receive the data voltage VDATA and the power supply voltage PVDD, and a second electrode of the first transistor T1 may be connected to a second node N2. A gate electrode of the second transistor T2 may be configured to receive the first scanning signal SCAN1, a first electrode of the second transistor T2 may be connected to the first node N1, and a second electrode of the second transistor T2 may be connected to the second node N2.

A gate electrode of the third transistor T3 may be configured to receive the light-emitting signal EMIT, a first electrode of the third transistor T3 may be connected to the second node N2, and a second electrode of the third transistor T3 may be connected to the anode of the light-emitting element EL. A gate electrode of the fourth transistor T4 may be configured to receive the second scanning signal SCAN2, a first electrode of the fourth transistor T4 may be configured to receive the initialization voltage VINIT, and a second electrode of the fourth transistor T4 may be connected to the anode of the light-emitting element EL.

Optionally, a cathode of the light-emitting element EL may be connected to a fixed voltage signal PVEE. Further, a first plate of the capacitor element C may be connected to the first node N1, and a second plate of the capacitor element C may be configured to receive the power supply voltage PVDD. A gate electrode of the fifth transistor T5 may be configured to receive the second scanning signal SCAN2, a first electrode of the fifth transistor T5 may be configured to receive the reference voltage VREF, and a second electrode of the fifth transistor T5 may be connected to the node N1.

Figure 6:
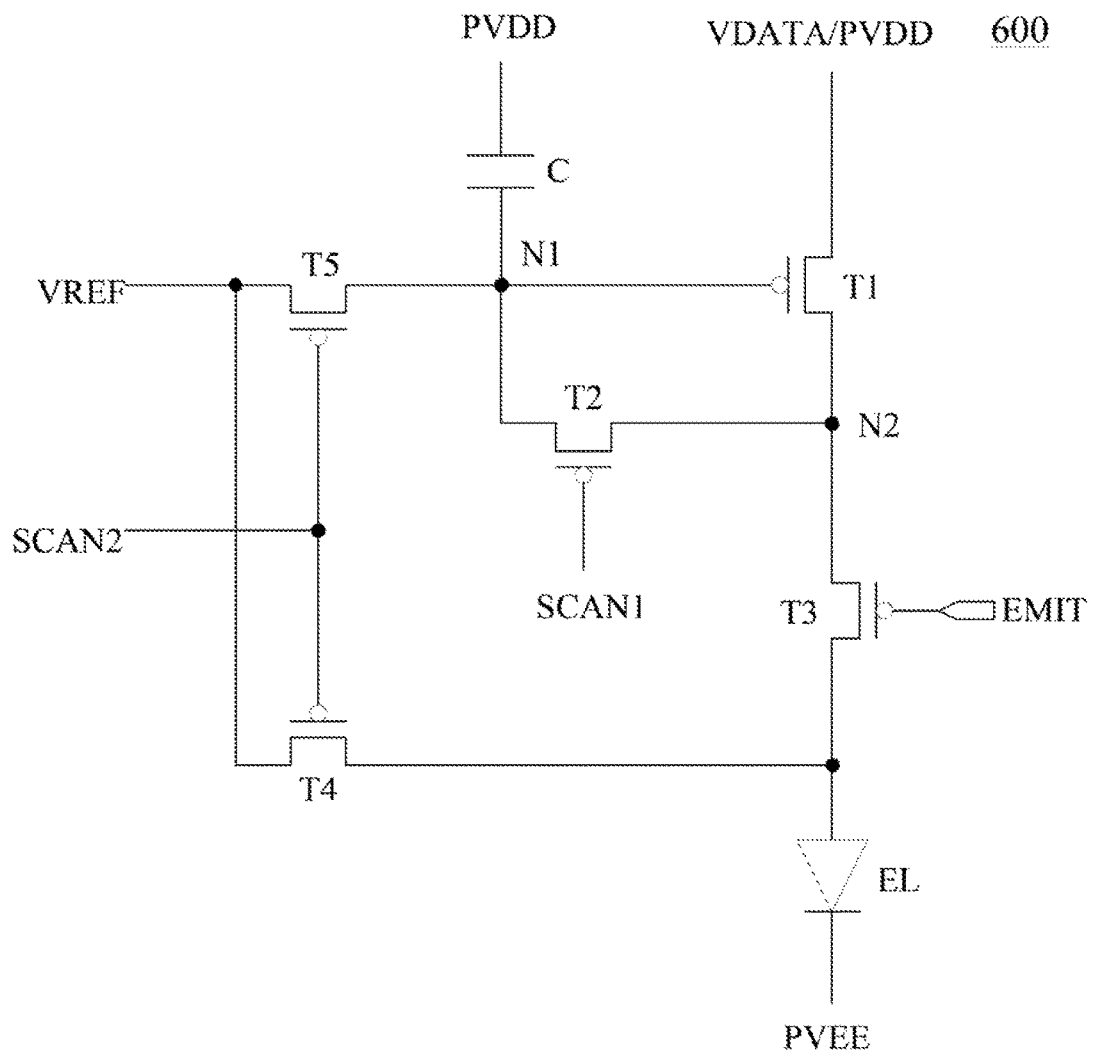
FIG. 6 illustrates an exemplary structural schematic view of another pixel circuit according to embodiments of the present disclosure.

FIG. 6 illustrates an exemplary structural schematic view of another pixel circuit 600 according to embodiments of the present disclosure. As shown in FIG. 6, the pixel circuit 600 may include a first transistor T1, a second transistor T2, a third transistor T3, a fourth transistor T4, a fifth transistor T3, a capacitor element C, and a light-emitting element EL.

More specifically, the first transistor T1 may be configured to, under control of a first voltage signal, time-sharingly receive a data voltage VDATA and a power supply voltage PVDD. Further, based on the data voltage VDATA, the first transistor T1 may generate a driving current. In the disclosed pixel circuit 600, the first voltage signal may be the reference voltage VREF.

The second transistor T2 may be configured to, under control of a first scanning signal SCAN1, detect and compensate threshold voltage deviation of the first transistor T1. The third transistor T3 may be configured to, under control of a light-emitting signal EMIT, transmit the driving current generated by the first, transistor T1 to the light-emitting element EL. The fourth transistor T4 may be configured to, under control of a second scanning signal SCAN2, transmit an anode reset, signal to an anode of the light-emitting element EL. In the disclosed pixel circuit 600, the anode reset signal may be the reference voltage VREF.

The fifth transistor T5 may be configured to, under control of the second scanning signal SCAN2, transmit the reference voltage VREF to control the first transistor T1. Further, the capacitor element C may be configured to store the data voltage VDATA transmitted to the first transistor T1. The light-emitting element EL may be configured to emit light in response to the driving current generated by the first transistor T1.

The disclosed pixel circuit 600 may include five transistors, one capacitor element, and one light-emitting element, thereby displaying reduced number of electronic elements and simplified circuit wiring with respect to existing pixel circuits. Accordingly, by using the disclosed pixel circuit 100, the demand for high PPI display device may be satisfied.

When the pixel circuit 600 is under work, the threshold detection and compensation of the driving transistor T1 may be effectively implemented, the gate electrode of the first transistor T1 and the anode of the light-emitting element EL may be reset, and the display unevenness induced by threshold voltage drift of the first transistor T1 may be avoided. Accordingly, the light-emitting element EL may be driven stably to emit light.

Further, the first transistor T1 of the pixel circuit 600 may be configured to time-sharingly receive the data voltage VDATA and the power supply voltage PVDD. Thus, the data voltage VDATA and the power supply voltage PVDD may be supplied by one signal line time-sharingly. Accordingly, the amount of circuit wires may be reduced, and the circuit wiring arrangement of the display device may be simplified, thereby providing display devices with higher PPI.

Further, in the pixel circuit 600, the reference voltage VREF may be configured to control the first transistor T1, and the reference voltage VREF may act as the anode reset signal for the light-emitting element EL. Accordingly, the number of circuit wires may be further reduced.

In some optional implementations, referring to FIG. 6, a gate electrode of the first transistor T1 may be connected to a first node N1, a first electrode of the first transistor T1 may time-sharingly receive the data voltage VDATA and the power supply voltage PVDD, and a second electrode of the first transistor T1 may be connected to a second node N2. A gate electrode of the second transistor T2 may be configured to receive the first scanning signal SCAN1, a first electrode of the second transistor T2 may be connected to the first node N1, and a second electrode of the second transistor T2 may be connected to the second node N2.

A gate electrode of the third transistor T3 may be configured to receive the light-emitting signal EMIT, a first electrode of the third transistor T3 may be connected to the second node N2, and a second electrode of the third transistor T3 may be connected to the anode of the light-emitting element EL. A gate electrode of the fourth transistor T4 may be configured to receive the second scanning signal SCAN2, a first electrode of the fourth transistor T4 may be configured to receive the reference voltage VREF, and a second electrode of the fourth transistor T4 may be connected to the anode of the light-emitting element EL.

Optionally, a cathode of the light-emitting element EL may be connected to a fixed voltage signal PVEE. Further, a first plate of the capacitor element C may be connected to the first node N1, and a second plate of the capacitor element C may be configured to receive the power supply voltage PVDD. A gate electrode of the fifth transistor T5 may be configured to receive the second scanning signal SCAN2, a first electrode of the fifth transistor T5 may be configured to receive the reference voltage VREF, and a second electrode of the fifth transistor T5 may be connected to the node N1.

According to different doping types of the substrate and source drain electrodes of the transistors, the transistors may be divided into P-type transistors (e.g., P-Metal-Oxide-Semiconductors, PMOS) and N-type transistors (e.g., N-Metal-Oxide-Semiconductors, NMOS). For example, in FIG. 5 or FIG. 6, the first transistor T1, the second transistor T2, the third transistor T3, the fourth transistor T4, and the fifth transistor T5 are all assumed to be PMOS transistors for illustrative purposes. In some optional implementations, the first transistor T1, the second transistor T2, the third transistor T3, the fourth transistor T4, and the fifth transistor T5 may be all assumed to be NMOS transistors.

In traditional transistors, the doped substrate may form source/drain regions, and the gate electrode may be configured to control the current reiterated in the channel region. As the transistors are scaled down to display channel length less than 100 nm, many issues may shown up in the traditional transistors. For example, the interactions between the source region and the drain region of a transistor may result in a deteriorated ability of the gate electrode in controlling the ON-and-OFF of electronic devices. Such a phenomenon may be known as THE "short channel effect (SCE)".

Issues related to the short channel effect, such as the leakage current within the source/drain regions and the reduction in the migration rate may be hard to overcome. Multi-gate transistors may control the gate electrodes from multiple sides because the gate electrodes are disposed on multiple sides of the channel region, thereby avoiding the short channel effect and increasing the driving current. In some optional implementations, the fifth transistor T5 may be a double-gate transistor.

Further, optionally, in some embodiments, the second transistor T2 may be a double-gate transistor. Further, in pixel circuits illustrated in FIG. 1 to FIG. 4, the first transistor T1, the second transistor T2, the third transistor T3 and the fourth transistor T4 may be all assumed as PMOS transistors for illustrative purposes. In some optional implementations, the first transistor T1, the second transistor T2, the third transistor T3 and the fourth transistor T4 may be all NMOS transistors.

Further, optionally, in the disclosed pixel driving circuits, the light-emitting element EL may be an organic light-emitting diode (OLED). The organic light-emitting diode may have advantages such as self-illumination, wide viewing angle, high contrast, and relatively low power consumption, etc.

Figure 7:
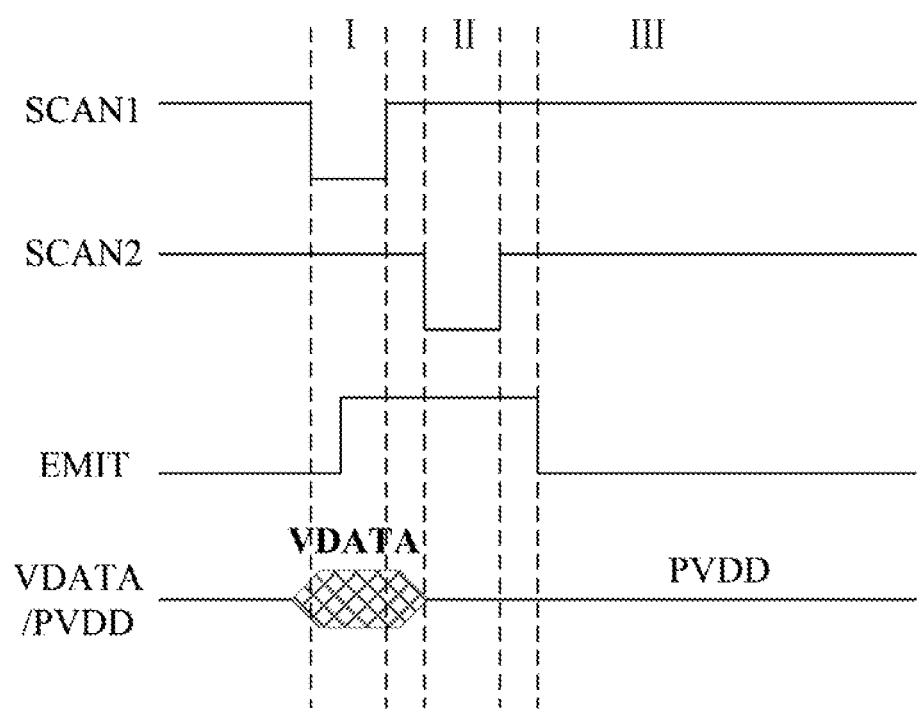
FIG. 7 illustrates an exemplary operational timing sequence of a pixel circuit in FIG. 1 and FIG. 3.
Figure 8:
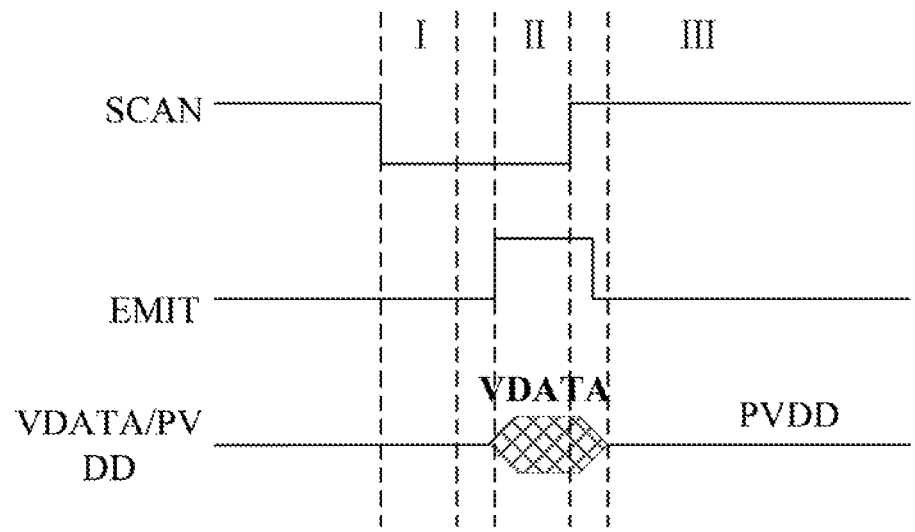
FIG. 8 illustrates an exemplary operational timing sequence of a pixel circuit in FIG. 2 and FIG. 4.
Figure 9:
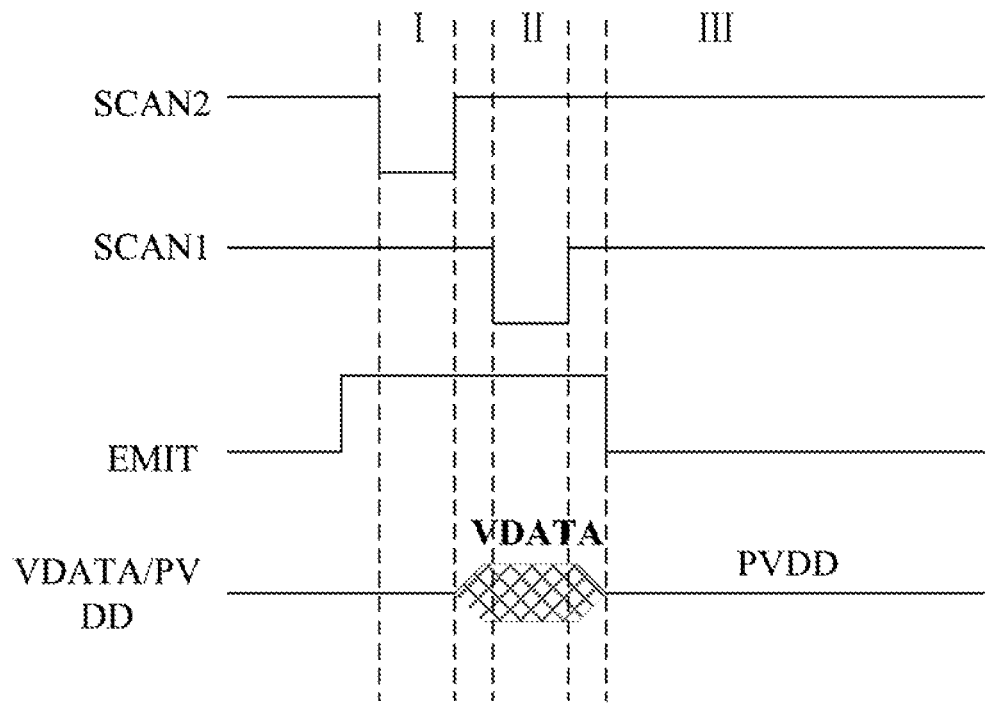
FIG. 9 illustrates an exemplary operational timing sequence of a pixel circuit in FIG. 5 and FIG. 6.

Hereinafter, the operational process of the disclosed pixel driving circuits is described more fully with reference to specific driving method set forth in descriptions of FIG. 7~FIG. 9 illustrates an exemplary operational timing sequence of pixel circuits in FIG. 1 and FIG. 3. As shown in FIG. 1 and FIG. 3, the first transistor T1, the second transistor T2, the third transistor T3, and the fourth transistor T4 may be all PMOS transistors.

Further, the first voltage signal supplied to the pixel circuits illustrated in FIG. 1 and FIG. 3 may have a low voltage level, and the second voltage signal supplied to the pixel circuits illustrated in FIG. 1 and FIG. 3 may have a high voltage level. However, the present disclosure is not limited thereto. For example, when the first transistor T1, the second transistor T2, the third transistor T3, and the fourth transistor T4 are all NMOS transistors, the first voltage signal supplied to the pixel circuits illustrated in FIG. 1 and FIG. 3 may have a high voltage level, and the second voltage signal-supplied to the pixel circuits illustrated in FIG. 1 and FIG. 3 may have a low voltage level.

Referring to FIG. 1 and FIG. 7, an operational timing sequence in FIG. 7 may be applied to drive the pixel circuit 100 illustrated in FIG. 1. In the pixel circuit 100 shown in FIG. 1, the first transistor T1 may be the driving transistor, and the threshold voltage of the first transistor T1 may be equal to Vth. Because the first transistor T1 is assumed as a P-type transistor for illustrative purposes, the Vth may have a negative value. Optionally, the light-emitting element EL in FIG. 1 may be assumed as an organic light-emitting diode.

Further, referring to FIG. 7, the operational timing sequence of the pixel circuit 100 in FIG. 1 may include a first stage I, a second stage II, and a third stage III. In the first stage I, the first scanning signal SCAN1 may have a first voltage level, the second scanning signal SCAN2 may have a second voltage level, and the light-emitting signal EMIT may switch from the first voltage level to the second voltage level. Further, the first electrode of the first transistor T1 may be configured to receive the data voltage VDATA.

Accordingly, in the pixel circuit 100, the second transistor T2 may be turned on under control of the first scanning signal SCAN1, and the fourth transistor T4 may be turned off under control of the second scanning signal SCAN2. The third transistor T3 may be first turned on and then turned off under control of the light-emitting signal EMIT.

In an earlier phase of the first stage I when the third transistor T3 is turned on, because the second transistor T2 is turned on, a signal at the anode of the light-emitting element EL may be transmitted to the gate electrode (the node N1) of the first transistor T1 via the third transistor T3 and the second transistor T2. Accordingly, the gate electrode of the first transistor T1 may be reset.

Further, because the signal at the anode of the light-emitting element EL is a low voltage level signal, the first transistor T1 may be turned on after the gate electrode of the first transistor T1 receives the signal transmitted from the anode of the light-emitting element EL. Further, in the first stage I, the first electrode of the first transistor T1 may receive the data voltage VDATA, and the data, voltage VDATA may be transmitted to the second node N2 via the first transistor T1. Thus, the voltage level at the second node N2 may be equal to VDATA−|Vth|.

Further, the data voltage VDATA may be transmitted to the first node N1 via the first transistor T1 and the second transistor T2, such that the voltage level at the first node N1 may be equal to VDATA−|Vth|. In a later stage of the first stage I, the third transistor T3 may be turned off to prevent the data voltage VDATA from being transmitted to the anode of the light-emitting element EL via the third transistor T3 and prevent the data voltage VDATA from affecting the voltage level at the anode of the light-emitting element EL.

In the second stage II, the first scanning signal SCAN1 may have the second voltage level, the second scanning signal SCAN2 may have the first voltage level, and the light-emitting signal EMIT may have the second voltage level. Accordingly, in the pixel circuit 100, the fourth transistor T4 may be turned on under control of the second scanning signal SCAN2, and the initialization voltage VINIT may be transmitted to the anode of the light-emitting element EL via the fourth transistor T4, thereby resetting the anode of the light-emitting element EL.

The second transistor T2 may be turned off under control of the first scanning signal SCAN1, and the third transistor T3 may be turned off under control of the light-emitting signal EMIT. Because of the maintenance function of the capacitor element C, the voltage level at the first node N1 may remain to be VDATA−|Vth|.

In the third stage III, the first scanning signal SCAN1 may have the second voltage level, the second scanning signal SCAN2 may have the second voltage level, and the light-emitting signal EMIT may base the first voltage level. Further, the first electrode of the first transistor T1 may be configured to receive the power supply voltage PVDD.

The second transistor T2 may be turned off under control of the first scanning signal SCAN1, and the fourth transistor T4 may be turned off under control of the second scanning signal SCAN2. Because of the maintenance function of the capacitor element C, the voltage level at the first node N1 may be still equal to VDATA−|Vth|. Further, because the voltage level of the power supply voltage PVDD is higher than VDATA−|Vth|, the first transistor T1 may be turned on.

Further, because the third transistor T3 is turned on under control of the light-emitting signal EMIT, the power supply voltage PVDD may be transmitted to the anode of the light-emitting element EL via the first transistor T1 and the third transistor T3, thereby providing a driving current to the light-emitting element EL. Further, the cathode of the light-emitting element EL may be configured to receive the fixed voltage signal PVEE. Because the voltage level of the power supply voltage PVDD is configured to be greater than the fixed voltage signal PVEE, the light-emitting element EL may be turned on and emit light.

Further, the driving current of an organic light-emitting diode is known to be directly proportional to the square of the voltage difference between the gate-source voltage and the threshold voltage of a driving transistor that drives the organic light-emitting diode. Accordingly, because the first transistor T1 is a driving transistor, the relationship between the driving current Iel of the light-emitting element EL and the gate-source voltage Vgs and the threshold voltage Vth of the first transistor T1 may be expressed as follows:

$$Iel \propto (Vgs-Vth)^2$$

Further, because the first transistor T1 in FIG. 1 is an PMOS transistor and the threshold voltage Vth of the first transistor T1 is a negative value, the driving current Iel of the light-emitting element EL may be expressed as follows:

$$Iel \propto (Vsg-|Vth|)^2$$

Where the source-gate electrode Vsg may be expressed as follows:

$$Vsg=Vs-Vg$$

Further, in the third stage III, the voltage level Vg of the gate electrode of the first transistor T1 may be equal to the voltage level at the first node N1 (i.e., Vg=VDATA−|Vth|). The voltage level of the source electrode of the first transistor T1 may be equal to the voltage level of the power supply voltage PVDD received by the first electrode of the first transistor T1 (i.e., Vs=PVDD). Accordingly, the source-gate electrode Vsg may be further expressed as follows:

$$Vsg=Vs-Vg=PVDD-(VDATA-|Vth|)$$

After substituting Vsg=Vs−Vg=PVDD−(VDATA−|Vth|) into Iel∝(Vsg−|Vth|)², the driving current Iel may be expressed as follows:

$$Iel \propto (Vsg-|Vth|)^2 = (PVDD-(VDATA-|Vth|)-|Vth|)^2 = (PVDD-VDATA)^2$$

As such, the driving current Iel that flows through the first transistor T1 to drive the light-emitting element EL may only be related to the power supply voltage PVDD and the data voltage VDATA. That is, the driving current Iel may not be related to the gate-source voltage Vgs and the threshold voltage Vth of the first transistor T1.

In existing technologies, because of reasons such as fabrication process and the aging of the device, the phenomenon of threshold voltage drift may exist in the driving transistors, resulting in the deviation of the driving current that Is configured to drive the light-emitting element to emit light. Further, the display images may be uneven induced by the deviation in the driving current, thereby affecting the display effect.

In the disclosed driving method, the driving current that flows through the driving transistor to drive the light-emitting element may be unrelated to the threshold voltage Vth of the driving transistor. Accordingly, the evenness of the display images may be enhanced, and the display effect of display panels may be improved.

Further, the operational timing sequence illustrated in FIG. 7 may also be applied to drive the pixel circuit 300 in FIG. 3. The threshold detection and compensation processes of the driving transistor in the pixel circuit 300 may refer to related descriptions of the pixel circuit 100, and are not described herein.

FIG. 8 illustrates an exemplary operational timing sequence of a pixel circuit in FIG. 2 and FIG. 4. As shown in FIG. 2 and FIG. 4, the first transistor T1, the second transistor T2, the third transistor T3, and the fourth transistor T4 may be all P-type transistors. Further, the first voltage signal supplied to the pixel circuits illustrated in FIG. 2 and FIG. 4 may have a low voltage level, and the second voltage signal supplied to the pixel circuits illustrated in FIG. 2 and FIG. 4 may have a high voltage level.

However, the present disclosure is not limited thereto. For example, when the first transistor T1, the second transistor T2, the third transistor T3, and the fourth transistor T4 are all NMOS transistors, the first voltage signal supplied to the pixel circuits illustrated in FIG. 2 and FIG. 4 may have a high voltage level, and the second voltage signal supplied to the pixel circuits illustrated in FIG. 2 and FIG. 4 may have a low voltage level.

Hereinafter, the working process of the pixel circuit 200 illustrated in FIG. 2 may be described in detail with reference to FIG. 8. In the pixel circuit 200, the first scanning signal and the second scanning signal may be the same signal that is denoted by SCAN. The gate electrode of the second transistor T2 and the gate electrode of the fourth transistor T4 may be configured to receive the scanning signal SCAN. Similarly to FIG. 7, the timing sequence in FIG. 8 may include a first stage I, a second stage II, and a third stage III.

In the first stage I, the scanning signal SCAN may have the first voltage level and the light-emitting signal EMIT may have the first voltage level. Accordingly, the second transistor T2 and the fourth transistor T4 may be turned on under control of the scanning signal SCAN. Because the fourth transistor T4 is turned on, the initialization voltage VINIT may be transmitted to the anode of the light-emitting element EL, thereby resetting the anode of the light-emitting element EL.

Further, the third transistor T3 may be turned on under control of the light-emitting signal EMIT, and because the second transistor T2 is turned on, the initialization voltage VINIT may be farther transmitted to the gate electrode (the node N1) of the first transistor T1 via the third transistor T3 and the second transistor T2. Accordingly, the gate electrode of the first transistor T1 may be reset.

In the second stage II, the scanning signal SCAN may have the first voltage level, the light-emitting signal EMIT may have the second voltage level, and the first electrode of the first transistor T1 may be configured to receive the data voltage VDATA. Accordingly, the second transistor T2 may be turned on under control of the scanning signal SCAN, and the third transistor T3 may be turned off under control of the light-emitting signal EMIT.

Because of the maintenance function of the capacitor element C, the voltage level at the first node N1 may be still equal to the initialization voltage VINIT. Further, because the initialization voltage VINIT is a low voltage level signal, the first transistor T1 may be turned on under control of the initialization voltage VINIT. Accordingly, the data voltage VDATA may be transmitted to the second node N2 via the first transistor T1, and the voltage level at the second node N2 may be equal to VDATA−|Vth|.

Further, because the second transistor T2 is turned on, the data voltage VDATA may be transmitted to the first node N1 via the first transistor T1, and the second transistor T2. Thus, the voltage level at the first node N1 may be equal to VDATA−|Vth|.

In the third stage III, the scanning signal SCAN may have the second voltage level, the light-emitting signal EMIT may have the first voltage level and the first electrode of the first transistor T1 may be configured to receive the power supply voltage PVDD. Accordingly, the second transistor T2 and the fourth transistor T4 may be turned off under control of the scanning signal SCAN.

Because of the maintenance function of the capacitor element C, the voltage level at the first node N1 may be still equal to VDATA−|Vth|. Because the voltage level of the power supply voltage PVDD is higher than VDATA−|Vth|, the first transistor T1 may be turned on. Further, the third transistor T3 may be turned on trader control of the light-emitting signal EMIT. Accordingly, the power supply voltage PVDD may be transmitted to the anode of the light-emitting element EL via the first transistor T1 and the third transistor T3, thereby providing a driving current to the light-emitting element EL.

Further, the cathode of the light-emitting element EL may be configured to receive the fixed volt age signal PVEE, and because the voltage level of the power supply voltage PVDD is higher than the voltage level of the fixed voltage signal PVEE, the light-emitting element EL may be turned on to emit light.

Further, the driving current of an organic light-emitting diode is known to be directly proportional to the square of the voltage difference between, the gate-source voltage and the threshold voltage of a driving transistor that drives the organic light-emitting diode. Because the first transistor T1 is a driving transistor, the relationship between the driving current Iel of the light-emitting element EL and the gate-source voltage Vgs and the threshold voltage Vth of the first transistor T1 may be expressed as follows:

$$Iel \propto (Vgs-Vth)^2$$

Further, because the first transistor T1 in FIG. 2 is an PMOS transistor and the threshold voltage Vth of the first transistor T1 is a negative value, the driving current Iel of the light-emitting element EL may be expressed as follows:

$$Iel \propto (Vsg-|Vth|)^2$$

Where the source-gate electrode Vsg may be expressed as follows:

$$Vsg=Vs-Vg$$

Further, in the third stage III, the voltage level Vg of the gate electrode of the first transistor T1 may be equal to the voltage level at the first, node N1 (i.e., Vg=VDATA−|Vth|). The voltage level of the source electrode of the first transistor T1 may be equal to the voltage level of the power supply voltage PVDD received by the first electrode of the first transistor T1 (i.e., Vs=PVDD). Accordingly, the source-gate electrode Vsg may be further expressed as follows:

$$Vsg=Vs-Vg=PVDD-(VDATA-|Vth|)$$

After substituting Vsg=Vs−Vg=PVDD−(VDATA−|Vth|) into Iel∝(Vsg−|Vth|)², the driving current (el may be expressed as follows:

$$Iel \propto (Vsg-|Vth|)^2=(PVDD-(VDATA-|Vth|)-|Vth|)^2=(PVDD-VDATA)^2$$

As such, the driving current Iel that flows through the first transistor T1 to drive the light-emitting element EL may only be related to the power supply voltage PVDD and the data voltage VDATA. That, is, the driving current Iel may not be related to the gate-source voltage Vgs and the threshold voltage Vth of the first transistor T1.

In the disclosed driving method, the driving current that flows through the driving transistor to drive the light-emitting element may be unrelated to the threshold voltage Vth of the driving transistor. Accordingly, the evenness of the display images may be enhanced, and the display effect of display panels may be improved.

Further, the operational timing sequence illustrated in FIG. 8 may also be applied to drive the pixel circuit 400 in FIG. 4. The threshold detection and compensation processes of the driving transistor in the pixel circuit 400 may refer to related descriptions of the pixel circuit 200, and are not described herein.

FIG. 9 illustrates an exemplary operational timing sequence of a pixel circuit in FIG. 5 and FIG. 6. As shown in FIG. 5 and FIG. 6, the first transistor T1, the second transistor T2, the third transistor T3, and the fourth transistor T4 may be all PMOS transistors. Further, the first voltage signal supplied to the pixel circuits illustrated in FIG. 5 and FIG. 6 may have a low voltage level, and the second voltage signal supplied to the pixel circuits illustrated in FIG. 5 and FIG. 6 may have a high voltage level.

However, the present disclosure is not limited thereto. For example, when the first transistor T1, the second transistor T2, the third transistor T3, and the fourth transistor T4 are all NMOS transistors, the first voltage signal supplied to the pixel circuits illustrated in FIG. 5 and FIG. 6 may have a high voltage level, and the second voltage signal supplied to the pixel circuits illustrated in FIG. 5 and FIG. 6 may have a low voltage level.

Hereinafter, the working process of the pixel circuit 500 illustrated in FIG. 5 may be described in detail with reference to FIG. 9. As shown in FIG. 5 and referring to FIG. 9, the pixel circuit 500 may include a fifth transistor T5, and the fifth transistor T5 may be configured to transmit a first voltage signal to the first transistor T1 under control of the second scanning signal SCAN2, thereby controlling the first transistor T1. The first voltage signal may be the reference voltage VREF.

Further, the first transistor T1 may be a driving transistor, and the threshold voltage of the first transistor T1 may be Vth. Because the first transistor T1 in FIG. 5 is assumed as a P-type transistor for illustrative purposes, the threshold voltage Vth of the first transistor T1 may have a negative value. Further, the light-emitting element EL may be an organic light-emitting diode.

Referring to FIG. 9, the liming sequence may include a first stage I, a second stage II, and a third stage III. In the first stage I, the first scanning signal SCAN1 may have the second voltage level, the second scanning signal SCAN2 may have the first voltage level, and the light-emitting signal EMIT may have the second voltage level. Accordingly, the second transistor T2 may be turned off under control of the first scanning signal SCAN1, and the third transistor T3 may be turned off under control of the light-emitting signal EMIT.

Further, the fourth transistor T4 and the fifth transistor T5 may be turned on under control of the first scanning signal SCAN1. Accordingly, the initialization voltage VINIT may be transmitted to the anode of the light-emitting element EL via the fourth transistor T4, thereby resetting the anode of the light-emitting element EL. The reference voltage VREF may be transmitted to the gate electrode of the first transistor T1 via the fifth transistor T5, thereby resetting the gate electrode of the first transistor T1. That is, the voltage level at the first node N1 may be equal to the voltage level of the reference voltage VREF.

In the second stage II, the first scanning signal SCAN1 may have the first voltage level, the second scanning signal SCAN2 may have the second voltage level, and the light-emitting signal EMIT may have the second voltage level. Further, the first electrode of the first transistor T1 may be configured to receive the data voltage VDATA.

Accordingly, the third transistor T3 may be turned off under control of the light-emitting signal EMIT, and the fourth transistor T4 and the fifth transistor T5 may be turned off under control of the first scanning signal SCAN2. The second transistor T2 may be turned on under control of the first scanning signal SCAN1.

Because of the maintenance function of the capacitor element C, the voltage level at the first node N1 may be still equal to the voltage level of the reference voltage VREF. Because the reference voltage VREF is a signal with low voltage level, the first transistor T1 may be turned on under control of the reference voltage VREF.

Thus, the data voltage VDATA may be transmitted to the second node N2 via the first transistor T1, and the voltage level at the second node N2 may be equal to VDATA−|Vth|. The data voltage VDATA may be further transmitted to the node N1 via the first transistor T1 and the second transistor T2. Accordingly, the voltage level at the first node N1 may be equal to VDATA−|Vth|.

Further, the voltage level of the reference voltage VREF may not be too low. If the voltage level of the reference voltage VREF is too low, a leakage current generated by the fifth transistor T5 may induce the voltage level at the node N1 to be abnormal, resulting in display brightness abnormity. Accordingly, the reference voltage VREF may have a relatively low voltage level to reset the node N1 and to reduce the leakage current generated by the fifth transistor T5.

In the third stage III, the first scanning signal SCAN1 may have the second voltage level, the second scanning signal SCAN2 may have the second voltage level, and the light-emitting signal EMIT may have the first voltage level. Further, the first electrode of the first transistor T1 may be configured to receive the power supply voltage PVDD.

Accordingly, the second transistor T2 may be turned off under control of the first scanning signal SCAN1, and the fourth transistor T4 and the fifth transistor T5 may be turned off under control of the second scanning signal SCAN2. Because of the maintenance function of the capacitor element C, the voltage level at the first node N1 may be still equal to VDATA−|Vth|. Further, because the voltage level of the power supply voltage PVDD is higher than VDATA−|Vth|, the first transistor T1 may be turned on.

Further, the third transistor T3 may be turned on under control of the light-emitting signal EMIT. Accordingly, the power supply voltage PVDD may be transmitted to the anode of the light-emitting element EL via the first transistor T1 and the third transistor T31, thereby providing a driving current to the light-emitting element EL. Further, the cathode of the light-emitting element EL may be configured to receive the fixed voltage signal PVEE. Because the voltage level of the power supply voltage PVDD is higher than the fixed voltage signal PVEE, the light-emitting element EL may be turned on to emit light.

Further, the driving current of an organic light-emitting diode is known to be directly proportional to the square of the voltage difference between the gate-source voltage and the threshold voltage of a driving transistor that drives she organic light-emitting diode. Because the first transistor T1 is a driving transistor, the relationship between the driving current Iel of the light-emitting element EL and the gate-source voltage Vgs and the threshold voltage Vth of the first transistor T1 may be expressed as follows:

$$Iel \propto (Vgs-Vth)^2$$

Further, because the first transistor T1 in FIG. 5 is an PMOS transistor and the threshold voltage Vth of the first transistor T1 is a negative value, the driving current Iel of the light-emitting element EL may be expressed as follows:

$$Iel \propto (Vsg-|Vth|)^2$$

Where the source-gate electrode Vsg may be expressed as follows:

$$Vsg = Vs - Vg$$

Further, in the third stage III, the voltage level Vg of the gate electrode of the first transistor T1 may be equal to the voltage level at the first node N1 (i.e., Vg=VDATA−|Vth|). The voltage level of the source electrode of the first transistor T1 may be equal to the voltage level of the power supply voltage PVDD received by the first electrode of the first transistor T1 (i.e., Vs=PVDD). Accordingly, the source-gate electrode Vsg may be further expressed as follows:

$$Vsg = Vs - Vg = PVDD - (VDATA - |Vth|)$$

After substituting Vsg=Vs−Vg=PVDD−(VDATA−|Vth|) into Iel∝(Vsg−|Vth|)², the driving current Iel may be expressed as follows:

$$Iel \propto (Vsg-|Vth|)^2 = (PVDD-(VDATA-|Vth|)-|Vth|)^2 = (PVDD-VDATA)^2$$

As such, the driving current Iel that flows through the first transistor T1 to drive the light-emitting element EL may only be related to the power supply voltage PVDD and the data voltage VDATA. That, is, the driving current Iel may not be related to the gate-source voltage Vgs and the threshold voltage Vth of the first transistor T1.

In the disclosed driving method, the driving current that flows through the driving transistor to drive the light-emitting element may be unrelated to the threshold voltage Vth of the driving transistor. Accordingly, the evenness of the display images may be enhanced, and the display effect of display panels may be improved.

Further, the operational timing sequence illustrated in FIG. 9 may also be applied to drive the pixel circuit 600 in FIG. 6. The threshold detection and compensation processes of the driving transistor in the pixel circuit 600 may refer to related descriptions of the pixel circuit 500, and are not described herein.

In one embodiment, to ensure the completeness of the signals, the first stage I, the second stage II, and the third stage III in the operational timing sequences illustrated in FIG. 7, FIG. 8, and FIG. 9 may have certain intervals therebetween to avoid signal input errors. Optionally, the intervals between each voltage level signals may not be necessary, and the present disclosure is not limited thereto.

Figure 10:
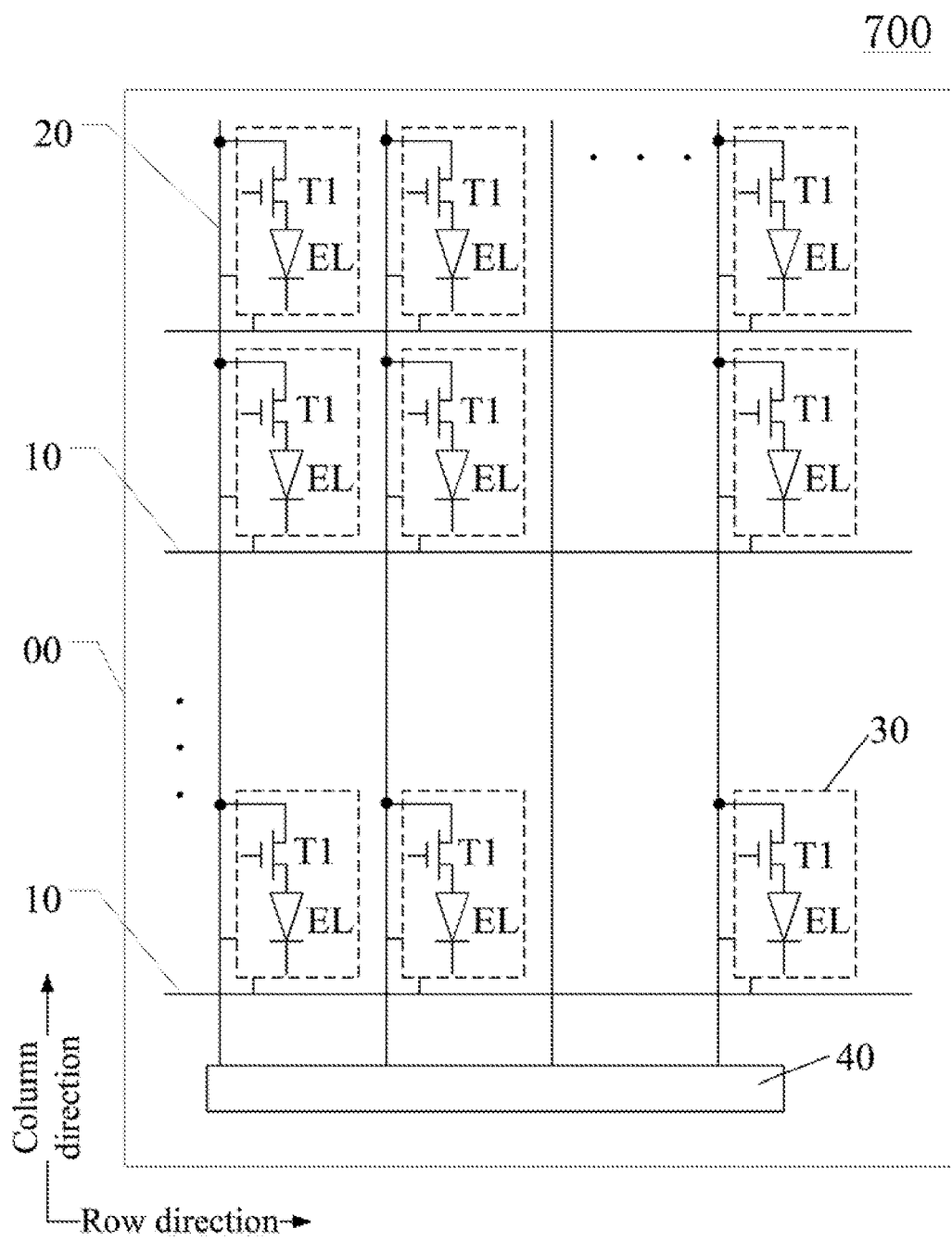
FIG. 10 illustrates an exemplary structural schematic view of a display device according to embodiments of the present disclosure.

The present disclosure also provides a display device, FIG. 10 illustrates an exemplary structural schematic view of a display device 700 according to embodiments of the present disclosure. Referring to FIG. 10, the display device 700 may include a first substrate 00, and the first substrate 00 may include a plurality of gate lines 10 extending along a row direction, and a plurality of data lines 20 extending along a column direction.

The plurality of gate lines 10 and the plurality of data lines 20 may be intersected and isolated to define a plurality of sub-pixels 30. For example, the plurality of sub-pixels 30 may be arranged in a plurality of rows and a plurality of columns. That is, the plurality of sub-pixels pixels 30 may be arranged in an array.

More specifically, a sub-pixel 30 may include a pixel circuit, and the pixel circuit may include a driving transistor denoted by T1, and a light-emitting element denoted by EL. First electrodes of driving transistors in a plurality of pixel circuits disposed in a same column of sub-pixels 30 may be electrically connected to a same data line 20 corresponding to such column of sub-pixels 30. Further, a data line 20 may be configured, to time-sharingly transmit a data voltage VDATA and a power supply voltage PVDD to first electrodes of a plurality of driving transistors in a same column of sub-pixels 30. That is, the power supply voltage line configured to transmit the power supply voltage PVDD may no longer be needed, thereby reducing the total number of signal lines included in the display device.

Optionally, in the disclosed display device 700, the first substrate 00 may be a rigid substrate such as a glass substrate. Or, the first substrate 00 may be a flexible substrate such as a polyimide substrate. Optionally, the row direction may be perpendicular to the column direction, and the present disclosure is not limited thereto.

In some optional implementations, the display device 700 may further include an integrated circuit (IC) chip 40, and the plurality of data lines 20 may be connected to the integrated circuit (IC) chip 40. The IC chip 40 may be configured to time-sharing supply the data voltage VDATA and the power supply-voltage PVDD to the plurality of data lines 20. Further, a data line 20 may be configured to time-sharingly transmit the data voltage VDATA and the power supply voltage PVDD to first electrodes of driving transistors of a plurality of pixel circuits in a same column of sub-pixels 30. In the disclosed display device, by using a data line 20 to time-sharingly transmit the data voltage VDATA and the power supply voltage PVDD, the wiring configuration of the first substrate 00 may be simplified.

In some optional implementations, a sub-pixel 30 may include a pixel circuit illustrated in any figure from FIGS. 1~6. Further, referring to FIG. 10 and taken in conjunction any pixel circuit illustrated in FIGS. 1~6, in some optional implementations, the gate electrodes of the second transistors T2 of pixel circuits in a same row of sub-pixels 30 may be electrically connected to a same gate line 10. The gate electrodes of the fourth transistors T4 of pixel circuits in a same row of sub-pixels 30 may be also electrically connected to a gate line 10.

Optionally, the gate electrode of the second transistor T2 and the gate electrode of the fourth transistor T4 may be connected to the same gate line 10. Or, optionally, the gate electrode of the second transistor T2 and the gate electrode of the fourth transistor T4 may be connected to two adjacent gate lines 10, respectively. When the gate electrode of the second transistor T2 and the gate electrode of the fourth transistor T4 are connected to the same gate line 10, the wiring configuration of the first substrate 00 may be simplified.

By using the display device including the aforementioned pixel circuit, the display evenness may be improved and the display effect may be enhanced, and other advantages may refer to the above descriptions of the pixel circuit and are not repeated herein. Further, the disclosed display device may be a display panel, or a device having a display function, such as a cell phone, a desktop, a notebook, a tablet, and an electronic paper.

Further, in existing organic light-emitting display devices, in a period of one frame, after a pixel circuit completes operations such as data write-in, the organic light-emitting diode in the pixel circuit may be immediately turned on to emit light. Further, from the first row of pixel circuits to the last row of pixel circuits in a scanning direction of the gate lines, the light-emitting duration of organic light-emitting diodes in a same row may decrease row by row. Such a phenomenon may be called full persistence.

The phenomenon of full persistence may result in a feeling of faintness, thereby largely affecting the sensual experience. In a VR display device, or an AR display device, in the period of one frame, often all pixels in the entire display panel may need to be in a light-emitting status or a dark status synchronously. That is, a global mode may need to be applied as the display mode in the VR or AR display devices.

In some embodiments, the disclosed display device 700 may be a VR display device or an AR display device including a plurality of pixel circuits illustrated in FIG. 5 or FIG. 6. All pixel circuits 500 or all pixel circuits 600 in the display device may be configured to receive a same light-emitting signal EMIT to yield an enhanced display effect. Further, the light-emitting signal EMIT may be transmitted by a single light-emitting signal line connected to an integrated circuit (IC) chip.

Accordingly, all the pixel circuits 500 or all the pixel circuits 600 may emit light simultaneously under control of the light-emitting signal. EMIT to effectively avoid the issue of full persistence. Thus, the demand of the VR display devices or the AR display devices for the display mode may be satisfied, and the sensual experience of the users may be improved.

Figure 11:
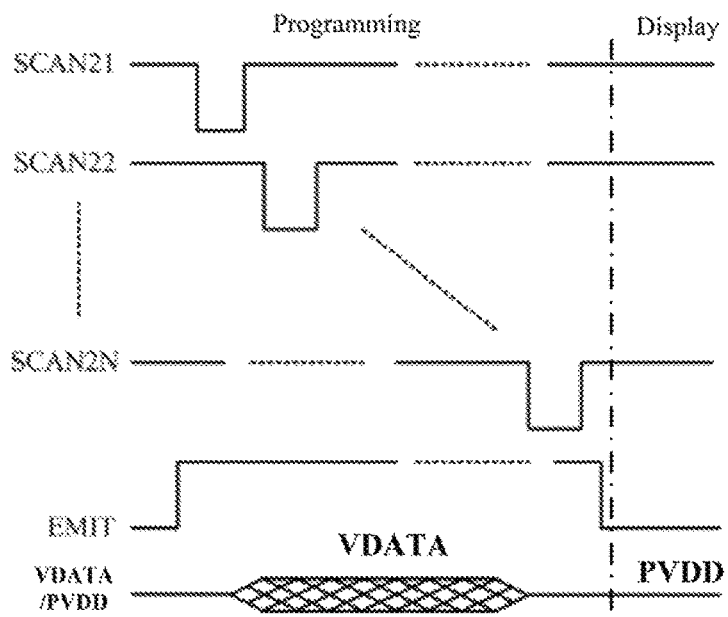
FIG. 11 illustrates an exemplary operational timing sequence of a display device including a plurality of pixel circuits in FIG. 6.
Figure 12:
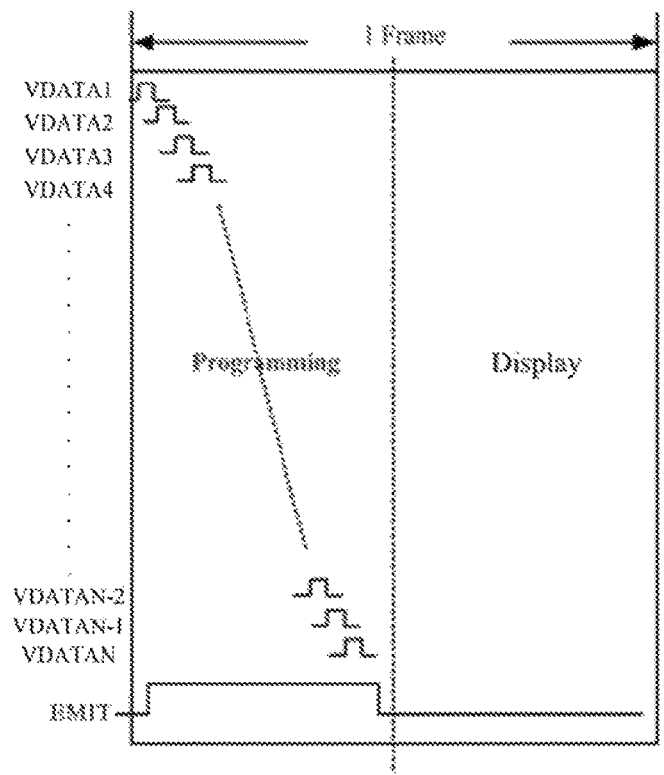
FIG. 12 illustrates a specific implementation of operational timing sequence of driving voltage in FIG. 11.

For example, FIG. 11 illustrates an exemplary operational timing sequence, of the display device including a plurality of pixel circuits 600 in FIG. 6. FIG. 12 illustrates a specific implementation of operational timing sequence of driving voltage in FIG. 11. More specifically, the display device may include a plurality of pixel circuits 600 arranged in an array and a plurality of first scanning signal lines SCAN11, SCAN12, . . . , and SCAN1N extending along a row direction of the array.

Further, a first scanning signal line SCAN1*m* may be connected to gate electrodes of second transistors T2 of a plurality of pixel circuits 600 disposed in an $m^{th}$ row, where m is a positive integer greater than 1 and less than N. That is, for example, the first scanning signal line SCAN11 may be connected to gate electrodes of second transistors T2 of a plurality of pixel circuits 600 disposed in the first row.

The display device may further include a plurality of second scanning signal lines SCAN21, SCAN22, . . . , and SCAN2N extending along the row direction. A second scanning signal line SCAN2*m* may be connected to gate electrodes of the fourth and fifth transistors (T4 and T5) of a plurality of pixel circuits 600 disposed in the $m^{th}$ row. Further, the first scanning signal line SCAN1*m* corresponding to a plurality of pixel circuit 600 in the $m^{th}$ row of sub-pixels may be multiplexed as a second scanning signal line SCAN2(m+1) corresponding to a plurality of pixel circuits 600 in the $(m+1)^{th}$ row of sub-pixels.

The display device may further include a light-emitting signal line supplying a light-emitting signal EMIT to the plurality of pixel circuits 600. The display device may further include a plurality of data lines DATA1, DATA2, . . . , DATAN extending along a column direction of the array. For example, a data line DATAn may be configured to time-sharingly supply a data voltage VDATA and a power supply voltage PVDD to a plurality of pixel circuits 600 in an $n^{th}$ column of pixel circuits 600.

As shown in FIG. 11 and FIG. 12, the operational timing sequence of the display device comprising a plurality of pixel circuits 600 in FIG. 6 may include a programming stage and a display stage. In the programming stage, initialization of the plurality of pixel circuits 600 may be fulfilled row by row, and data write-in of the plurality of pixel circuits 600 may be fulfilled column by column. In the display stage, the plurality of pixel circuits 600 may be configured to emit light simultaneously. That is, a global mode for displaying the display device may be implemented.

Figure 13:
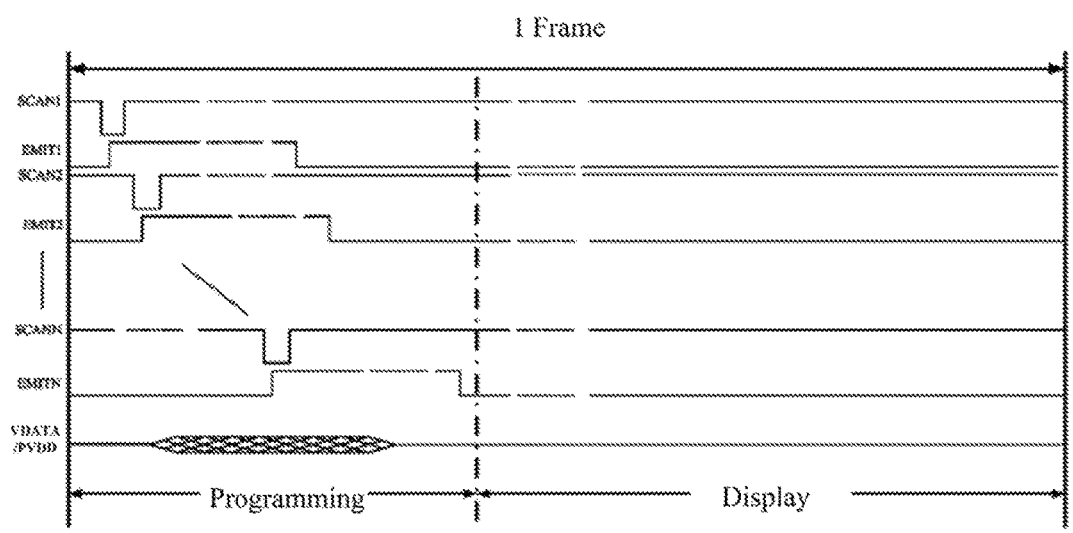
FIG. 13 illustrates an exemplary operational timing sequence of a display device including a plurality of pixel circuits in FIG. 2.

FIG. 13 illustrates an exemplary operational timing sequence of the display device including, a plurality of pixel circuits 200 described in FIG. 2. The plurality of pixel circuits 200 may be arranged in an array. The display device may include a plurality of scanning signal lines SCAN1, SCAN2, . . . , and SCANN extending along a row direction of the array. A scanning signal line SCANm may be connected to gate electrodes of second and fourth transistors (T2 and T4) of a plurality of pixel circuits 200 disposed in an $m^{th}$ row, where m is a positive integer. Further, all pixel circuits 200 in the display device may be configured to receive a light-emitting signal EMIT. The light-emitting signal EMIT may be transmitted by a plurality of light-emitting signal lines connected to a vertical shift register (VSR).

The display device may further include a plurality of data lines extending along a column direction of the array and time-sharingly supplying a data voltage VDATA and a power supply voltage PVDD to the plurality of pixel circuits 200. As shown in FIG. 13, the operational timing sequence of the display device comprising a plurality of pixel circuits 200 described in FIG. 2 may include a programming stage and a display stage. In the programming stage, initialization and data write-in of the plurality of pixel circuits 200 may be fulfilled row by row or column by column.

Further, in the display stage, the plurality of the pixel circuits 200 may be configured to emit light simultaneously. That is, a global mode for displaying the display device may be implemented. Further, the disclosed display device may be a VR display device or an AR display device, and the driving method in FIG. 13 may be applied to drive the VR or AR display device.

It should be noted that, the above detailed descriptions illustrate only preferred embodiments of the present disclosure and technologies and principles applied herein. Those skilled in the art can understand that the present disclosure is not limited to the specific embodiments described herein, and numerous significant alterations, modifications and alternatives may be devised by those skilled in the art without departing from the scope of the present disclosure. Thus, although the present disclosure has been illustrated in above-described embodiments in details, the present disclosure is not limited to the above embodiments. Any equivalent or modification thereof, without departing from the spirit and principle of the present invention, falls within the true scope of the present invention, and the scope of the present disclosure is defined by the appended claims.

What is claimed is:

1. A pixel circuit, comprising:
   a light-emitting element;
   a first transistor, configured to time-sharingly receive a data voltage and a power supply voltage under control of a first voltage signal and to generate a driving current based on the data voltage;
   a second transistor, configured to detect and compensate a threshold voltage deviation of the first transistor under control of a first scanning signal, wherein a reference voltage signal is coupled through a capacitor element to a gate electrode of the first transistor and a first electrode of the second transistor;
   a third transistor, configured to provide the driving current to the light-emitting element via the first transistor under control of a light-emitting signal;
   a fourth transistor, configured to transmit an anode reset signal to an anode of the light-emitting element under control of a second scanning signal, wherein the anode reset signal is an initialization voltage; and
   the capacitor element, configured to store the data voltage transmitted to the first transistor,
   wherein the light-emitting element is configured to emit light in response to the driving current generated by the first transistor.

2. The pixel circuit according to claim 1, wherein:
   the first voltage signal is a reference voltage, and
   the first voltage signal is multiplexed as the anode reset signal.

3. The pixel circuit according to claim 1, wherein:
   the first voltage signal is an initialization voltage, and
   the first voltage signal is multiplexed as the anode reset signal.

4. The pixel circuit according to claim 1, wherein:
   the first scanning signal and the second scanning signal are connected to a same scanning signal.

5. The pixel circuit according to claim 1, wherein:
   the second transistor is a double-gate transistor.

6. The pixel circuit according to claim 1, wherein:
   the first transistor, the second transistor, the third transistor, and the fourth transistor are all P-type transistors or all N-type transistors, and the light-emitting element is an organic light-emitting diode.

7. The pixel circuit according to claim 1, wherein:
the data voltage and the power supply voltage are directly connected to the first transistor by a single line time-sharingly.

8. The pixel circuit according to claim 1, wherein:
the gate electrode of the first transistor is connected to a first node, a first electrode of the first transistor is configured to time-sharing receive the data voltage and the power supply voltage, and a second electrode of the first transistor is connected to a second node;
a gate electrode of the second transistor is configured to receive the first scanning signal, the first electrode of the second transistor is connected to the first node, and the second electrode of the second transistor is connected to the second node;
a gate electrode of the third transistor is configured to receive the light-emitting signal, a first electrode of the third transistor is connected to the second node, and a second electrode of the third transistor is connected to the anode of the light-emitting element;
a gate electrode of the fourth transistor is configured to receive the second scanning signal, a first electrode of the fourth transistor is configured to receive the anode reset signal, and a second electrode of the fourth transistor is connected to the anode of the light-emitting element; and
a first plate of the capacitor element is connected to the first node, and a second plate of the capacitor element is configured to receive a fixed voltage signal.

9. The pixel circuit according to claim 8, wherein:
the fixed voltage signal received by the second plate of the capacitor element is a reference voltage.

10. The pixel circuit according to claim 1, further comprising:
a fifth transistor, configured to transmit the first voltage signal to the first transistor under control of the second scanning signal.

11. The pixel circuit according to claim 10, wherein:
the gate electrode of the first transistor is connected to a first node, a first electrode of the first transistor is configured to time-sharing receive the data voltage and the power supply voltage, and a second electrode of the first transistor is connected to a second node;
a gate electrode of the second transistor is configured to receive the first scanning signal, the first electrode of the second transistor is connected to the first node, and the second electrode of the second transistor is connected to the second node;
a gate electrode of the third transistor is configured to receive the light-emitting signal, a first electrode of the third transistor is connected to the second node, and a second electrode of the third transistor is connected to the anode of the light-emitting element;
a gate electrode of the fourth transistor is configured to receive the second scanning signal, a first electrode of the fourth transistor is configured to receive the anode reset signal, and a second electrode of the fourth transistor is connected to the anode of the light-emitting element;
a first plate of the capacitor element is connected to the first node, and a second plate of the capacitor element is configured to receive the power supply voltage; and
a gate electrode of the fifth transistor is configured to receive the second scanning signal, a first electrode of the fifth transistor is configured to receive the first voltage signal, and a second electrode of the fifth transistor is connected to the first node.

12. The pixel circuit according to claim 11, wherein:
the fifth transistor is a double-gate transistor.

13. The pixel circuit according to claim 11, wherein:
the first transistor, the second transistor, the third transistor, the fourth transistor, the fifth transistor are all P-type transistors or all N-type transistors.

14. A driving method of a pixel circuit, wherein the pixel circuit includes a light-emitting element, a first transistor configured to time-sharingly receive a data voltage and a power supply voltage under control of a first voltage signal, a second transistor configured to detect and compensate a threshold voltage deviation of the first transistor under control of a first scanning signal, wherein a reference voltage signal is coupled through a capacitor element to a gate electrode of the first transistor and a first electrode of the second transistor, a third transistor configured to provide a driving current generated by the first transistor to the light-emitting element under control of a light-emitting signal, a fourth transistor configured to transmit a reset signal to the light-emitting element under control of a second scanning signal, wherein the anode reset signal is an initialization voltage, and the capacitor element connected to the first transistor, the driving method comprising:
in a processing stage, fulfilling initialization and threshold detection of the pixel circuit; and
in a display stage, configuring the light-emitting element to emit light.

15. The driving method according to claim 14, wherein:
the processing stage includes a first stage and a second stage;
the display stage includes a third stage;
in the first stage, the first scanning signal is configured to have a first voltage level, the second scanning signal is configured to have a second voltage level, the light-emitting signal is switched from the first voltage level to the second voltage level, and the data voltage is supplied to a first electrode of the first transistor;
in the second stage, the first scanning signal is configured to have the second voltage level, the second scanning signal is configured to have the first voltage level, and the light-emitting signal is configured to have the second voltage level; and
in the third stage, the first and the second scanning signals are configured to have the second voltage level, the light-emitting signal is configured to have the first voltage level, and the power supply voltage is supplied to the first electrode of the first transistor.

16. The driving method according to claim 14, wherein:
the pixel circuit further includes a fifth transistor configured to control the first transistor under control of the second scanning signal line,
the processing stage includes a first stage and a second stage;
the display stage includes a third stage;
in the first stage, the first scanning signal is configured to have a second voltage level, the second scanning signal is configured to have a first voltage level, the light-emitting signal is configured to have the second voltage level;
in the second stage, the first scanning signal is configured to have the first voltage level, the second scanning signal is configured to have the second voltage level, the light-emitting signal is configured to have the second voltage level, and the data voltage is supplied to a first electrode of the first transistor; and in a third stage, the first and the second scanning signals are configured to have the second voltage level, the light-emitting signal is configured to have the first voltage level, and the power supply voltage is supplied to the first electrode of the first transistor.

17. A driving method of a pixel circuit, wherein the pixel circuit includes a light-emitting element, a first transistor configured to time-sharingly receive a data voltage and a power supply voltage under control of a first voltage signal, a second transistor configured to detect and compensate a threshold voltage deviation of the first transistor under control of a scanning signal, wherein a reference voltage signal is coupled through a capacitor element to a gate electrode of the first transistor and a first electrode of the second transistor, a third transistor configured to provide a driving current generated by the first transistor to the light-emitting element under control of a light-emitting signal, a fourth transistor configured to transmit a reset signal to the light-emitting element under control of the scanning signal, wherein the anode reset signal is an initialization voltage, and the capacitor element connected to the first transistor, the driving method comprising:

in a first stage, configuring the scanning signal to have a first voltage level, and configuring the light-emitting signal to have the first voltage level;

in a second stage, configuring the scanning signal to have the first voltage level, configuring the light-emitting signal to have the second voltage level, and providing the data voltage to the first electrode of the first transistor; and in a third stage, configuring the scanning signal to have the second voltage level, configuring the light-emitting signal to have the first voltage level, and providing the power supply voltage to the first electrode of the first transistor.

18. A display device comprising a first substrate including a plurality of gate lines extending along a row direction and a plurality of data lines extending along a column direction, the plurality of gate lines and the plurality of data lines being intersected to define a plurality of sub-pixels arranged in a plurality of rows and a plurality of columns, wherein:

a sub-pixel comprises a pixel circuit including a driving transistor and a light-emitting element;

first electrodes of driving transistors of a plurality of pixel circuits in a same column of sub-pixels are connected to a corresponding data line; and a data line is configured to time-sharing transmit the data voltage and the power supply voltage to a first electrode of a driving transistor.

19. The display device according to claim 18, wherein the pixel circuit comprises:

a light-emitting element;

a first transistor, configured to time-sharingly receive a data voltage and a power supply voltage under control of a first voltage signal and to generate a driving current based on the data voltage;

a second transistor, configured to detect and compensate a threshold voltage deviation of the first transistor under control of a first scanning signal;

a third transistor, configured to provide the driving current to the light-emitting element via the first transistor under control of a light-emitting signal;

a fourth transistor, configured to transmit an anode reset signal to an anode of the light-emitting element under control of a second scanning signal; and the capacitor element, configured to store the data voltage transmitted to the first transistor, wherein the light-emitting element is configured to emit light in response to the driving current generated by the first transistor.

20. The display device according to claim 19, wherein:

gate electrodes of second transistors in a plurality of pixel circuits in a same row of sub-pixels are connected to a same gate line, and gate electrodes of fourth transistors in a plurality of pixel circuits in a same row of sub-pixels are connected to a same gate line.

* * * * *